(12) United States Patent
Hwang et al.

(10) Patent No.: US 8,901,745 B2
(45) Date of Patent: Dec. 2, 2014

(54) THREE-DIMENSIONAL SEMICONDUCTOR DEVICES

(71) Applicant: Samsung Electronics Co., Ltd., Suwon-si (KR)

(72) Inventors: Sung-Min Hwang, Seoul (KR); Hansoo Kim, Suwon-si (KR); Wonseok Cho, Suwon-si (KR); Jaehoon Jang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/771,526

(22) Filed: Feb. 20, 2013

(65) Prior Publication Data

US 2013/0161831 A1 Jun. 27, 2013

Related U.S. Application Data

(63) Continuation of application No. 12/963,241, filed on Dec. 8, 2010, now Pat. No. 8,394,716.

(30) Foreign Application Priority Data

Dec. 18, 2009 (KR) .................. 10-2009-0126855

(51) Int. Cl.
*H01L 29/40* (2006.01)
*H01L 23/48* (2006.01)
*H01L 23/52* (2006.01)
*H01L 23/522* (2006.01)
*H01L 27/115* (2006.01)

(52) U.S. Cl.
CPC ....... *H01L 23/5226* (2013.01); *H01L 27/11526* (2013.01); *H01L 27/11551* (2013.01); *H01L 27/11556* (2013.01)

USPC .......................................................... 257/775

(58) Field of Classification Search
USPC .......................................................... 257/775
See application file for complete search history.

(56) References Cited

U.S. PATENT DOCUMENTS

| | | | |
|---|---|---|---|
| 6,747,356 B2 * | 6/2004 | Ando et al. ................... | 257/758 |
| 6,800,886 B2 * | 10/2004 | Awano .......................... | 257/276 |
| 6,967,398 B2 * | 11/2005 | Frech et al. ................... | 257/691 |
| 7,253,091 B2 | 8/2007 | Brewer et al. | |
| 7,332,805 B2 * | 2/2008 | Natarajan et al. ............. | 257/700 |

(Continued)

FOREIGN PATENT DOCUMENTS

| | | |
|---|---|---|
| JP | 2007-180389 | 7/2007 |
| JP | 2008-072051 | 3/2008 |
| JP | 2008-192857 | 8/2008 |
| KR | 1020080034816 | 4/2008 |

*Primary Examiner* — Yu-Hsi D Sun
*Assistant Examiner* — Grant Withers
(74) *Attorney, Agent, or Firm* — Myers Bigel Sibley & Sajovec, P.A.

(57) ABSTRACT

A three-dimensional semiconductor device may include a substrate including wiring and contact regions and a thin film structure on the wiring and contact regions of the substrate. The thin-film structure may include a plurality of alternating wiring layers and inter-layer insulating layers defining a terraced structure in the contact region so that each of the wiring layers includes a contact surface in the contact region that extends beyond others of the wiring layers more distant from the substrate. A plurality of contact structures may extend in a direction perpendicular to a surface of the substrate with each of the contact structures being electrically connected to a contact surface of a respective one of the wiring layers. Related methods are also discussed.

17 Claims, 35 Drawing Sheets

(56) References Cited

U.S. PATENT DOCUMENTS

| | | | |
|---|---|---|---|
| 7,351,660 B2* | 4/2008 | Brewer et al. | 438/689 |
| 7,838,996 B2* | 11/2010 | Sato et al. | 257/775 |
| 7,863,751 B2* | 1/2011 | Takase | 257/774 |
| 7,927,926 B2 | 4/2011 | Katsumata et al. | |
| 8,048,798 B2 | 11/2011 | Kidoh et al. | |
| 8,058,708 B2* | 11/2011 | Maebashi | 257/621 |
| 8,159,070 B2* | 4/2012 | Lin et al. | 257/758 |
| 8,183,602 B2* | 5/2012 | Tabata et al. | 257/211 |
| 8,476,754 B2* | 7/2013 | Kodani | 257/690 |
| 2003/0001280 A1* | 1/2003 | Noguchi et al. | 257/774 |
| 2006/0091445 A1 | 5/2006 | Utsuno | |
| 2008/0099819 A1 | 5/2008 | Kito et al. | |
| 2008/0315296 A1 | 12/2008 | Tanaka et al. | |
| 2009/0090965 A1 | 4/2009 | Kito et al. | |
| 2009/0146206 A1 | 6/2009 | Fukuzumi et al. | |
| 2009/0230449 A1 | 9/2009 | Sakaguchi et al. | |
| 2009/0230450 A1 | 9/2009 | Shiino et al. | |
| 2009/0230458 A1 | 9/2009 | Ishiduki et al. | |
| 2009/0230462 A1 | 9/2009 | Tanaka et al. | |
| 2009/0242967 A1 | 10/2009 | Katsumata et al. | |
| 2009/0267135 A1 | 10/2009 | Tanaka et al. | |
| 2010/0038703 A1 | 2/2010 | Fukuzumi et al. | |
| 2010/0096682 A1 | 4/2010 | Fukuzumi et al. | |
| 2010/0109065 A1 | 5/2010 | Oh et al. | |
| 2010/0133599 A1 | 6/2010 | Chae et al. | |
| 2010/0193861 A1 | 8/2010 | Shim et al. | |
| 2010/0207184 A1 | 8/2010 | Kim et al. | |
| 2010/0213527 A1 | 8/2010 | Shim et al. | |
| 2010/0240205 A1 | 9/2010 | Son et al. | |
| 2010/0254191 A1 | 10/2010 | Son et al. | |
| 2010/0258947 A1 | 10/2010 | Jeong et al. | |
| 2010/0315875 A1 | 12/2010 | Kim et al. | |
| 2010/0320528 A1 | 12/2010 | Jeong et al. | |
| 2011/0002178 A1 | 1/2011 | Hwang et al. | |
| 2011/0065270 A1 | 3/2011 | Shim et al. | |
| 2011/0076819 A1 | 3/2011 | Kim et al. | |
| 2011/0115010 A1 | 5/2011 | Shim et al. | |
| 2011/0147801 A1 | 6/2011 | Shim et al. | |
| 2011/0175159 A1 | 7/2011 | Itagaki et al. | |
| 2011/0180941 A1 | 7/2011 | Hwang et al. | |
| 2011/0199825 A1 | 8/2011 | Han et al. | |
| 2011/0199833 A1 | 8/2011 | Shim et al. | |
| 2011/0284943 A1 | 11/2011 | Hwang et al. | |
| 2011/0287623 A1 | 11/2011 | Oh et al. | |
| 2011/0291172 A1 | 12/2011 | Hwang et al. | |
| 2011/0298013 A1 | 12/2011 | Hwang et al. | |
| 2011/0309431 A1 | 12/2011 | Kidoh et al. | |
| 2011/0310670 A1 | 12/2011 | Shim et al. | |
| 2011/0317489 A1 | 12/2011 | Kim et al. | |
| 2012/0003800 A1 | 1/2012 | Lee et al. | |
| 2012/0032245 A1 | 2/2012 | Hwang et al. | |
| 2012/0032250 A1 | 2/2012 | Son et al. | |
| 2012/0033503 A1 | 2/2012 | Kim et al. | |
| 2012/0061744 A1 | 3/2012 | Hwang et al. | |
| 2012/0098049 A1 | 4/2012 | Moon et al. | |
| 2012/0098050 A1 | 4/2012 | Shim et al. | |
| 2012/0099387 A1 | 4/2012 | Shim et al. | |
| 2012/0119287 A1 | 5/2012 | Park et al. | |
| 2012/0120740 A1 | 5/2012 | Shim et al. | |
| 2012/0140562 A1 | 6/2012 | Choe et al. | |
| 2012/0193705 A1 | 8/2012 | Lim et al. | |
| 2012/0195125 A1 | 8/2012 | Choe et al. | |
| 2012/0205722 A1 | 8/2012 | Lee et al. | |
| 2012/0208347 A1 | 8/2012 | Hwang et al. | |
| 2012/0211816 A1 | 8/2012 | Yahashi | |
| 2012/0228712 A1 | 9/2012 | Jeong et al. | |
| 2012/0256253 A1 | 10/2012 | Hwang et al. | |

* cited by examiner

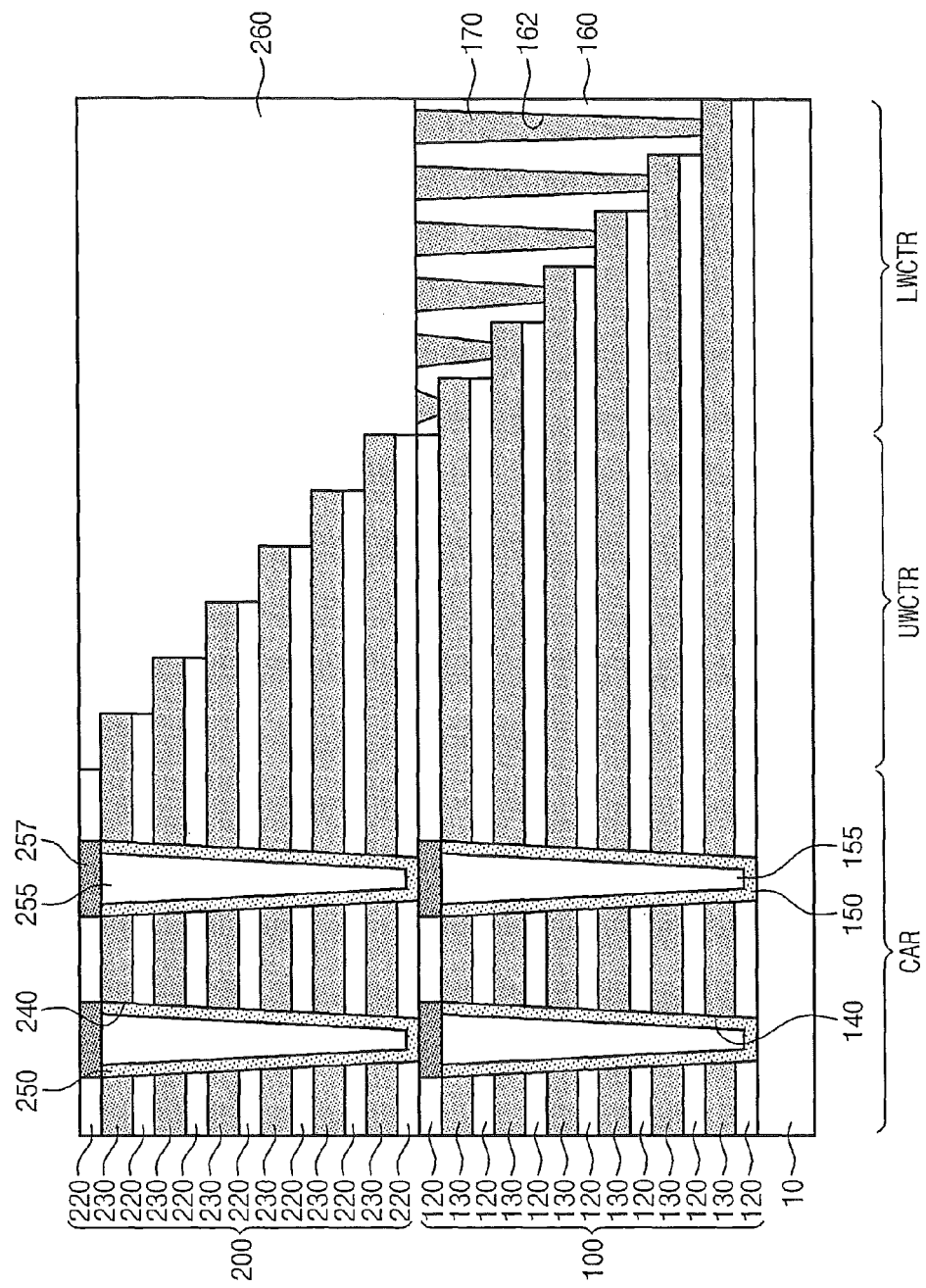

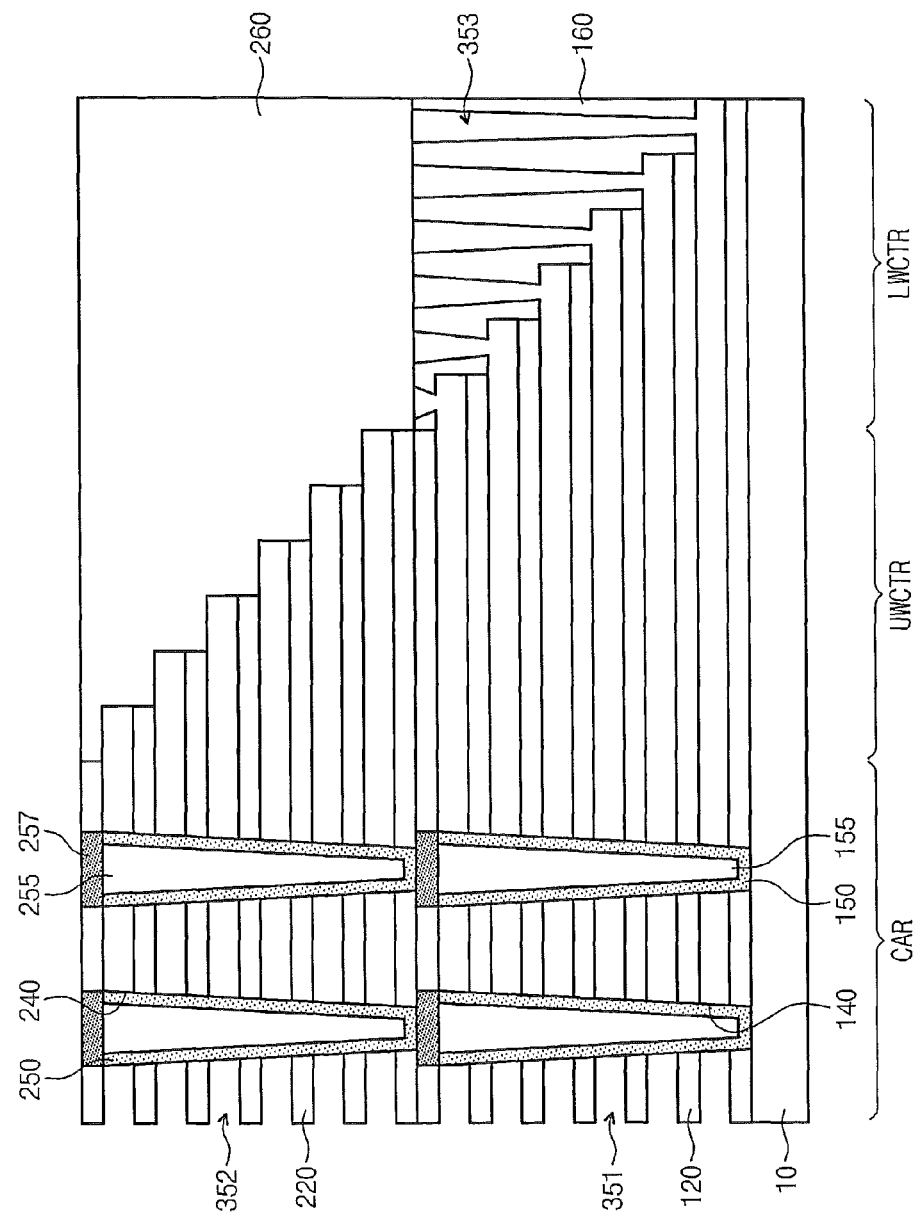

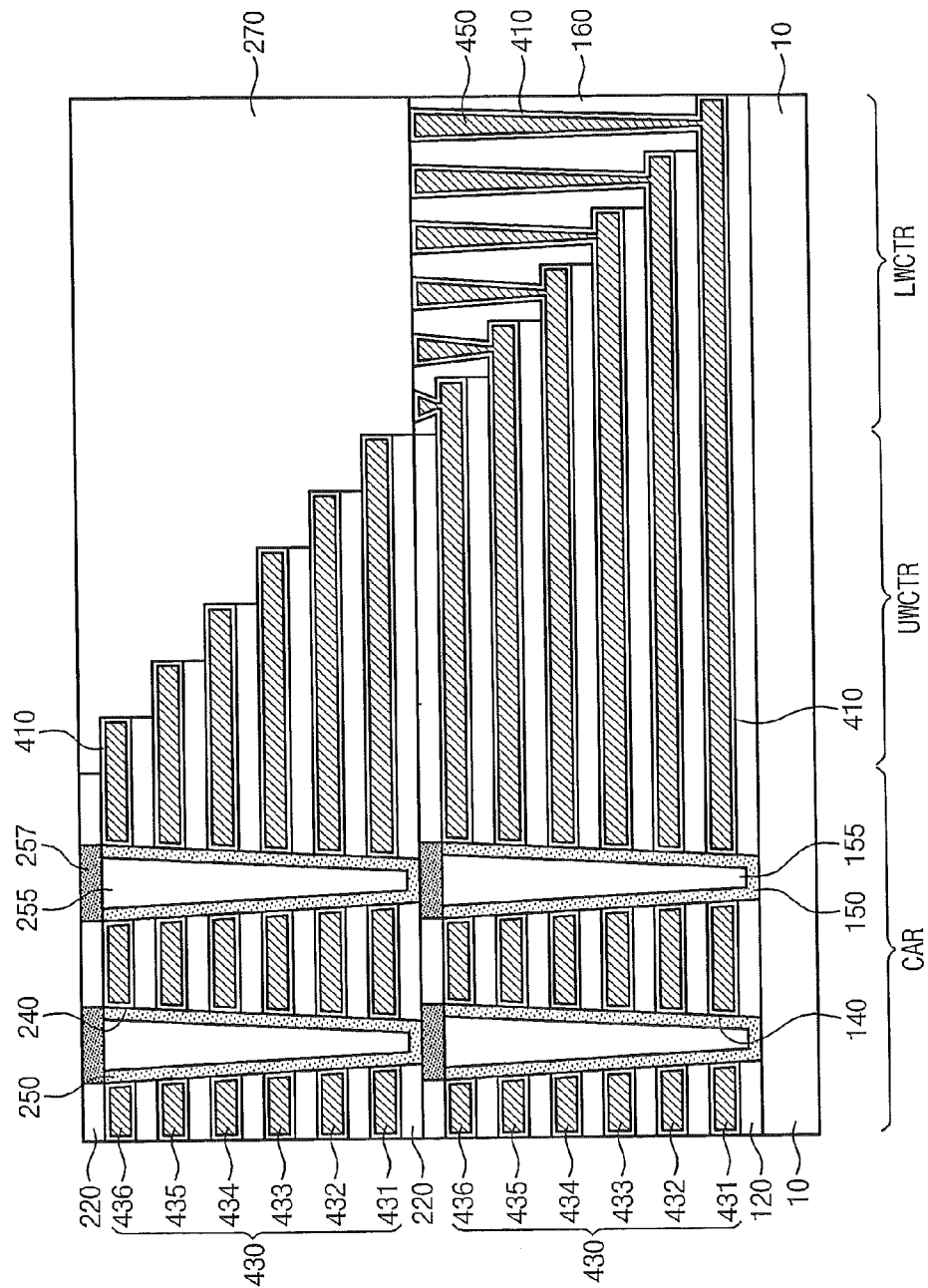

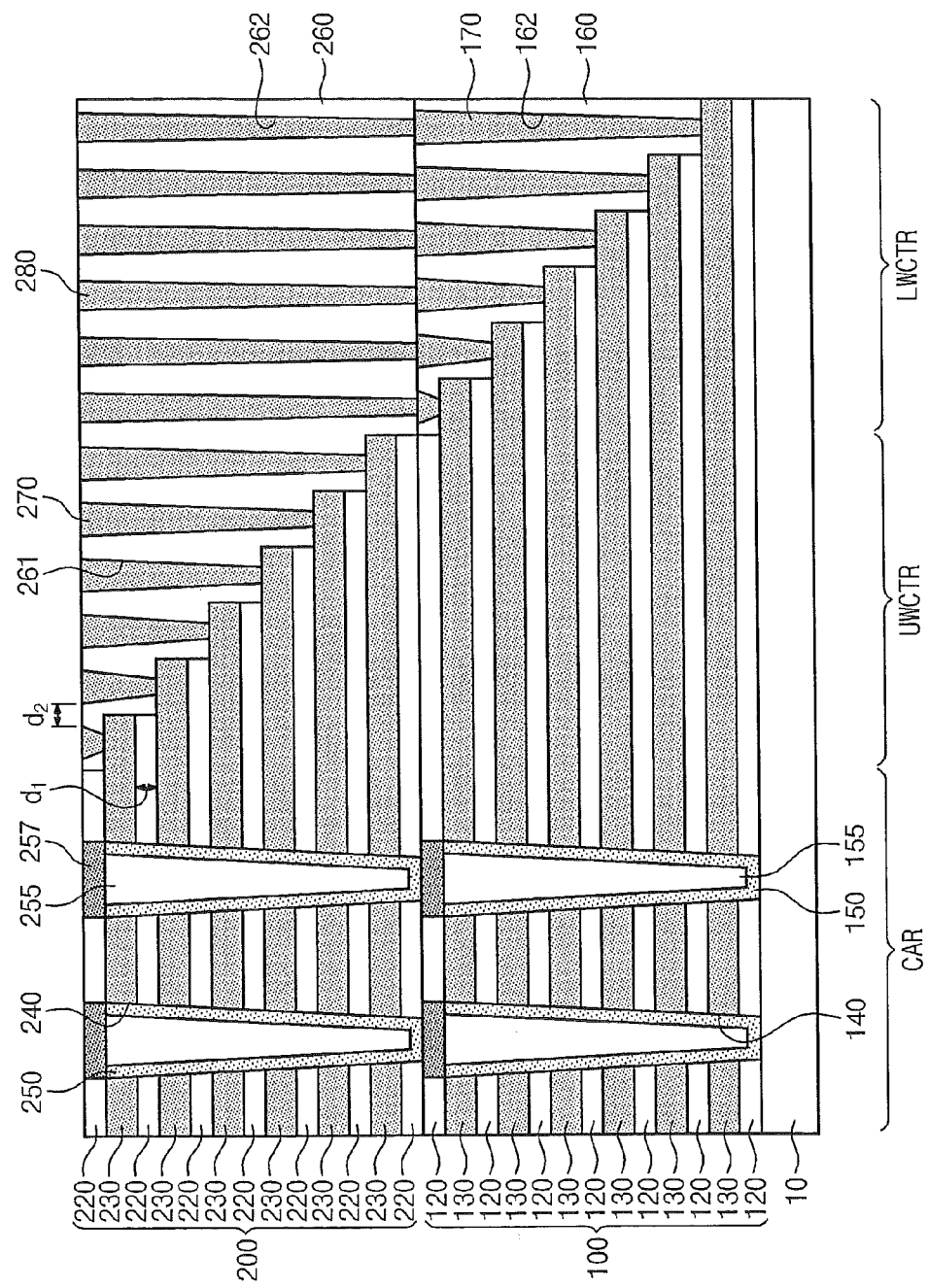

US 8,901,745 B2

THREE-DIMENSIONAL SEMICONDUCTOR DEVICES

CROSS-REFERENCE TO RELATED APPLICATIONS

This U.S. non-provisional patent application claims the benefit of priority as a continuation of U.S. application Ser. No. 12/963,241 filed Dec. 8, 2010, which claims the benefit of priority under 35 U.S.C. §119 of Korean Patent Application 10-2009-0126855, filed on Dec. 18, 2009. The disclosures of both of the above referenced applications are hereby incorporated herein in their entirety by reference.

BACKGROUND

The present disclosure herein relates to methods of manufacturing three-dimensional semiconductor devices and related three-dimensional semiconductor devices.

Recently, demand for higher integration of semiconductor devices has increased to obtain improved performance and/or low price for user needs. In semiconductor memory devices, higher integration may be particularly required, since integration is a significant factor in determining prices. In two-dimensional or planar semiconductor devices, since the integration degree mainly depends on an area occupied by a unit memory cell, integration is affected by the technique(s) used to form fine patterns. In order to realize minute patterns, however, an increase in integration of the two dimensional semiconductor devices may be restricted since it may be necessary to install expensive equipment.

In order to overcome these restrictions, there have been suggested three-dimensional semiconductor devices including memory cells arranged three-dimensionally. In order to realize mass production of the three-dimensional devices, however, a manufacturing technique may be required to achieve reliable product characteristics while reducing a manufacturing cost per bit more than that of two dimensional semiconductor devices.

SUMMARY

Embodiments of inventive concepts may provide a method of manufacturing the three-dimensional semiconductor device. A substrate may be prepared including a wiring region and a contact region. A thin film structure may be formed including a plurality of sacrificial layers and inter-layer insulating layers alternately laminated on the substrate and having a terraced shape in the contact region. An insulating layer may be formed covering the thin film structure in the contact region. Sacrificial contact patterns may be formed connected vertically to the sacrificial layers in the contact region, respectively. Horizontal recess regions may be formed between the inter-layer insulating layers and contact recess regions extending from the horizontal recess regions in the insulating layer by removing both the sacrificial layers and the sacrificial contact patterns, and forming wiring patterns and contact plugs extending continuously from the wiring patterns, respectively, by filling the horizontal contact recess regions and the contact recess regions with a conductive material.

Embodiments of the inventive concept may also provide a three-dimensional semiconductor device. A may substrate include a wiring region and a contact region. A plurality of wiring structures may be laminated on the substrate with each of the wiring structures including a wiring section parallel to an upper surface of the substrate in the wiring region and a contact section extending continuously from an end portion of the wiring section so as to be vertical to the substrate in the contact region. In this case, the distance between the contact sections adjacent to each other is larger than the distance between the wiring sections vertically adjacent to each other.

According to some embodiments of inventive concepts, a three-dimensional semiconductor device may include a substrate including wiring and contact regions and a thin film structure on the wiring and contact regions of the substrate. The thin-film structure may include a plurality of alternating wiring layers and inter-layer insulating layers defining a terraced structure in the contact region so that each of the wiring layers includes a contact surface in the contact region that extends beyond others of the wiring layers more distant from the substrate. A plurality of contact structures may extend in a direction perpendicular to a surface of the substrate with each of the contact structures being electrically connected to a contact surface of a respective one of the wiring layers.

According to some other embodiments of inventive concepts, a method of forming a three-dimensional semiconductor device may include forming a thin film structure on wiring and contact regions of a substrate. The thin film structure may include a plurality of alternating sacrificial layers and inter-layer insulating layers, and the thin film structure may define a terraced structure in the contact region. An insulating layer may be formed on the terraced structure in the contact region, and sacrificial contact patterns may be formed through the insulating layer in the contact region in a direction perpendicular with respect to a surface of the substrate, with each of the sacrificial contact patterns being connected to a respective one of the sacrificial layers. The sacrificial layers and the sacrificial contact patterns may be removed to define recess regions between the inter-layer insulating layers and through the insulating layer, and wiring patterns may be formed in the recess regions between the inter-layer insulating layers and through the insulating layer.

BRIEF DESCRIPTION OF THE DRAWINGS

The accompanying drawings are included to provide a further understanding of inventive concepts, and are incorporated in and constitute a part of this specification. The drawings illustrate exemplary embodiments of inventive concepts and, together with the description, serve to explain principles of inventive concept. In the drawings:

FIGS. 1C, 2C, 3C, 4C, 5C, and 6C are cross sectional views illustrating sequential operations of manufacturing the three-dimensional semiconductor device according to the first embodiments of inventive concepts along a y-z plane of FIGS. 1A, 2A, 3A, 4A, 5A, and 6A;

FIGS. 10B, 11B, and 12B are cross sectional views illustrating sequential operations of manufacturing the three-dimensional semiconductor device according to the second embodiments of inventive concepts along a y-z plane of FIGS. 10A, 11A, and 12A;

DETAILED DESCRIPTION OF THE EMBODIMENTS

Figure 1A:
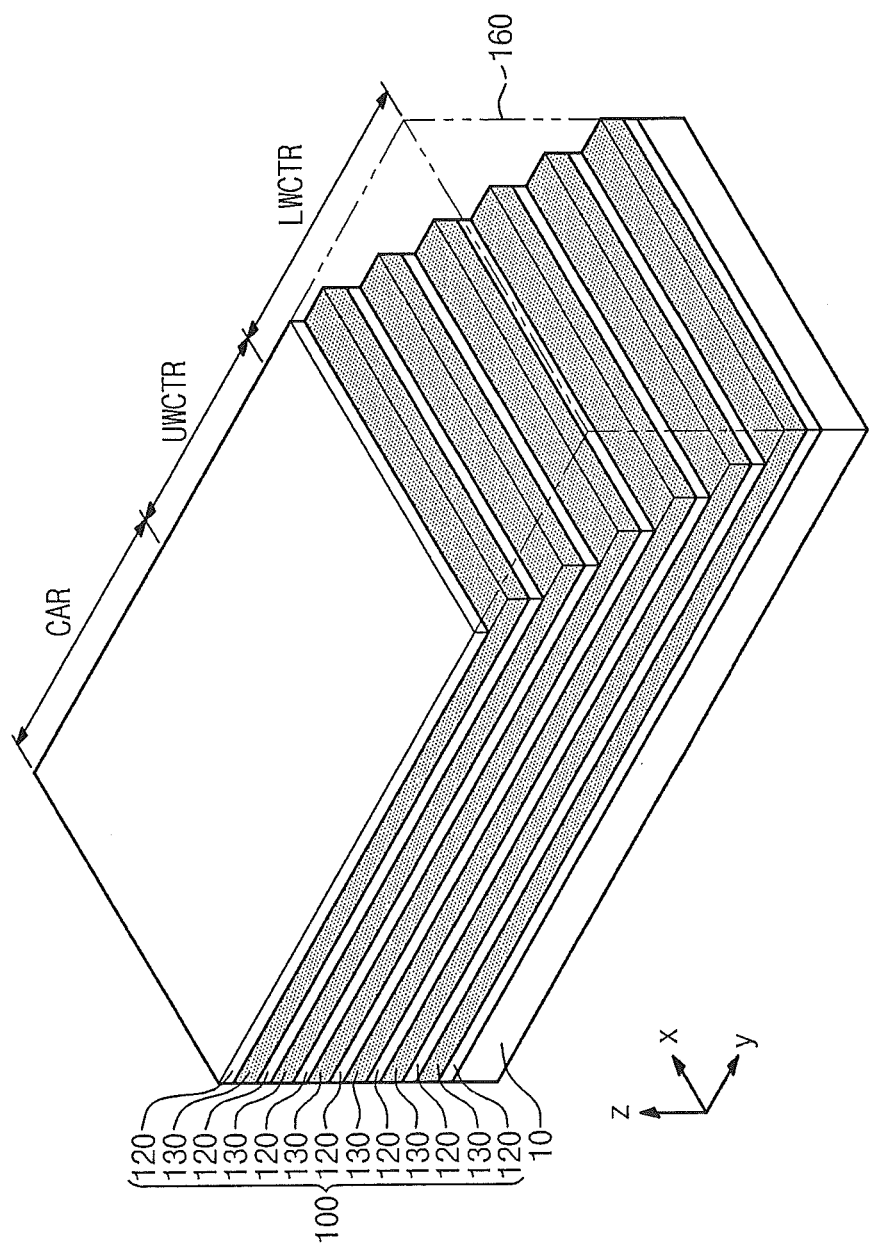
FIGS. 1A, 2A, 3A, 4A, 5A, and 6A are perspective views illustrating sequential operations of a method of manufacturing a three-dimensional semiconductor device according to first embodiments of inventive concepts.

Advantages and features of inventive concepts and methods of accomplishing the same may be understood more readily by reference to the following detailed description of embodiments and the accompanying drawings. Inventive concepts may, however, be embodied in many different forms and should not be construed as being limited to embodiments set forth herein. Rather, these embodiments are provided so that this disclosure will be thorough and complete and will fully convey inventive concepts to those skilled in the art, and inventive concepts will only be defined by the appended claims. Like reference numerals refer to like elements throughout the specification.

It will be understood that when an element is referred to as being "on", "connected to", or "coupled to" another element, it can be directly on, directly connected to, or directly coupled to the other element or intervening elements may be present. In contrast, when an element is referred to as being "directly on", "directly connected to", or "directly coupled to" another element, there are no intervening elements present. Like numbers refer to like elements throughout. As used herein, the term "and/or" includes any and all combinations of one or more of the associated listed items.

It will be understood that, although the terms first, second, etc. may be used herein to describe various elements, components, layers, and/or sections, these elements, components, layers, and/or sections should not be limited by these terms. These terms are only used to distinguish one element, component or section from another element, component, or section. Thus, a first element, component, layer, or section discussed below could be termed a second element, component, layer, or section without departing from the teachings of inventive concepts.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In addition, when terms used in this specification are not specifically defined, all the terms used in this specification (including technical and scientific terms) can be understood by those skilled in the art. Further, when general terms defined in the dictionaries are not specifically defined, the terms will have the normal meaning in the art.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, layers, and/or components, but do not preclude the presence or addition of one or more other features, integers, steps, operations, elements, layers, components, and/or groups thereof.

In the drawings, the illustrated features may be changed due to, for example, the manufacturing technology and/or tolerance. Accordingly, it should be understood that example embodiments of inventive concepts are not limited to the drawings but include modifications of the features of elements caused due to, for example, the manufacture.

Hereinafter, methods of manufacturing three-dimensional semiconductor devices according to embodiments of inventive concepts will be described in conjunction with the accompanying drawings.

FIGS. 1A, 2A, 3A, 4A, 5A, and 6A are perspective views illustrating sequential operations of manufacturing a three-dimensional semiconductor device according to first embodiments of inventive concepts. FIGS. 1B, 2B, 3B, 4B, 5B, and 6B are cross sectional views illustrating sequential operations of manufacturing three-dimensional semiconductor devices according to first embodiments of inventive concepts along an x-z plane of FIGS. 1A, 2A, 3A, 4A, 5A, and 6A. FIGS. 1C, 2C, 3C, 4C, 5C, and 6C are cross sectional views illustrating sequential operations of manufacturing the three-dimensional semiconductor device according to first embodiments of inventive concepts along a y-z plane of FIGS. 1A, 2A, 3A, 4A, 5A, and 6A. FIG. 7 is a cross sectional view illustrating a contact structure of the three-dimensional semiconductor device according to first embodiments of inventive concepts;

A three-dimensional semiconductor device according to some embodiments of inventive concepts may include a cell array region CAR (or a wiring region) and contact regions UWCTR and LWCTR. Memory cells with a three-dimensional structure are formed in the cell array region CAR. In the contact regions UWCTR and LWCTR, contact plugs are formed to connect the memory cells to peripheral circuits. The contact regions UWCTR and LWCTR of the three-dimensional semiconductor device according to embodiments of inventive concepts include a lower word line contact region LWCTR and an upper word line contact region LWCTR. The upper word line contact region UWCTR is disposed closer to the cell array region CAR than the lower word line contact region LWCTR.

Figure 1B:
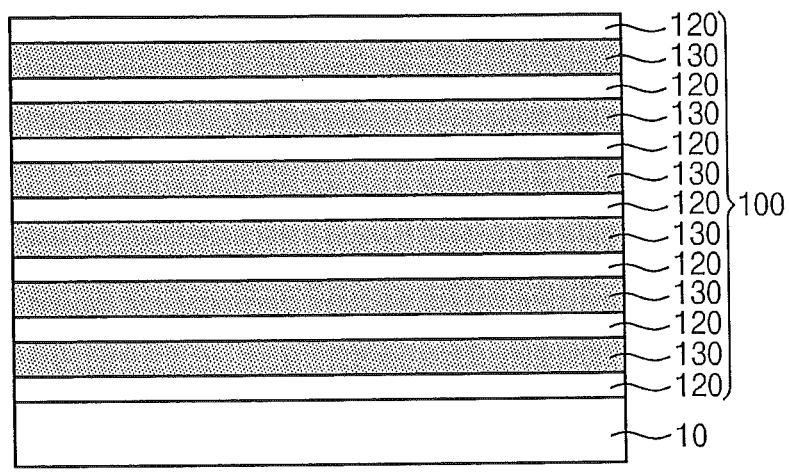
FIGS. 1B, 2B, 3B, 4B, 5B, and 6B are cross sectional views illustrating sequential operations of the method of manufacturing the three-dimensional semiconductor device according to the first embodiments of inventive concepts along an x-z plane of FIGS. 1A, 2A, 3A, 4A, 5A, and 6A.
Figure 1C:
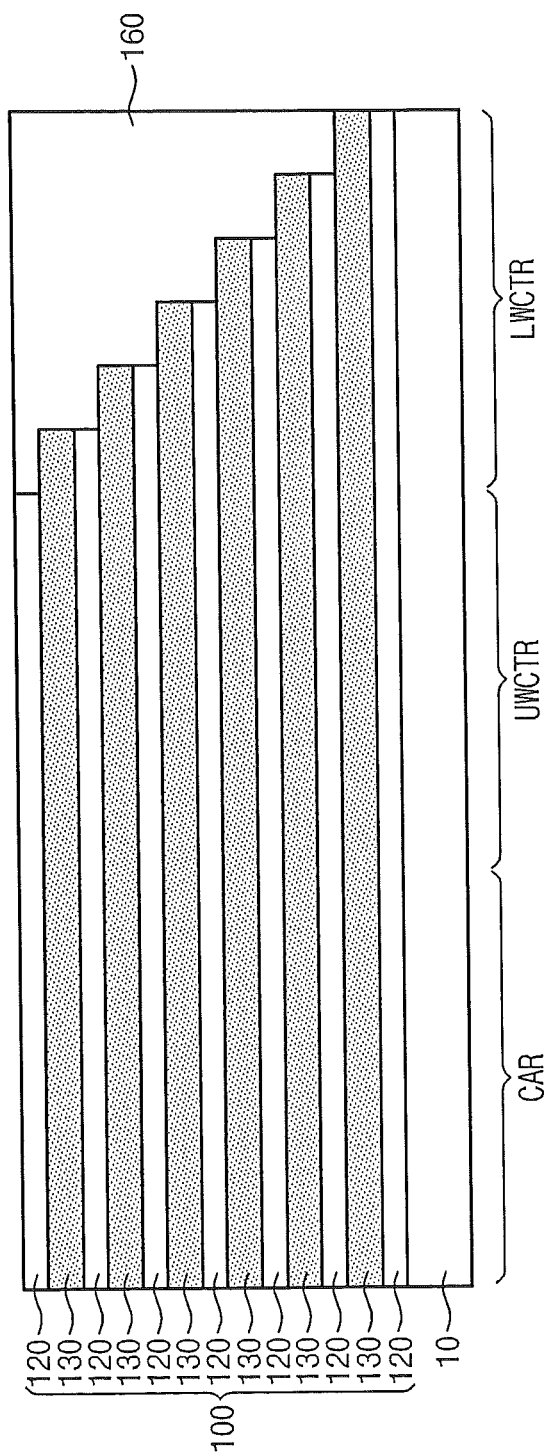

Referring to FIGS. 1A, 1B, and 1C, a lower thin film structure 100 is formed on a substrate 10. The lower thin film structure 100 may include a plurality of lower inter-layer insulating layers 120 and a plurality of lower sacrificial layers 130. The lower inter-layer insulating layers 120 and the lower sacrificial layers 130 may be laminated alternately and repeatedly.

The substrate 10 may be formed of a material (for example, a silicon wafer) with semiconductor characteristics. According to other embodiments, the substrate 10 may be formed of an insulating material (for example, glass) or a semiconductor or a conductive member covered with an insulating material.

The lower inter-layer insulating layers 120 and the lower sacrificial layers 130 may be formed of different materials having etching selectivity with respect to each other. For example, each lower inter-layer insulating layer 120 may be formed of at least one of a silicon oxide layer and a silicon nitride layer. Each lower sacrificial layer 130 may be formed of a material selected from a silicon layer, a silicon oxide layer, a silicon carbide, and/or a silicon nitride layer and different from that of the lower inter-layer insulating layer 120. Other embodiments of inventive concepts may further include forming an impurity region (not illustrated) in the substrate 10, before the lower thin film structure 100 is formed.

Subsequently, by patterning the lower thin film structure 100, a contact region with a terraced shape is formed at the lower word line contact region LWCTR.

Specifically, a sacrificial mask pattern (not illustrated) may be formed on the lower thin film structure 100, and then the contact region in terraced shape may be formed by etching the lower thin film structure 100. Therefore, as the lower sacrificial layers 130 are more distant from the substrate 10, the distance between the cell array region CAR and one-sidewalls of the lower sacrificial layers 130 may become shorter. That is, the areas of the lower sacrificial layers 130 may be decreased, as the lower sacrificial layers 130 are more distant from the substrate 10.

The sacrificial mask pattern (not illustrated) may be formed of one or more materials having etching selectivity with respect to the materials of the lower inter-layer insulating layers 120 and the lower sacrificial layers 130. According to some embodiments of inventive concepts, the sacrificial mask pattern may be formed of one of organic materials and/or photoresist materials. The thickness of the sacrificial mask pattern may be thicker than the area of the contact regions LWCTR and UWCTR.

The patterning of the lower thin film structure 100 may include exhaustive etching performed using the sacrificial mask pattern as an exhaustive etching mask. Specifically, the exhaustive etching may include a plurality of lower patterning. The lower patterning may include horizontal etching and vertical etching.

The horizontal etching may be performed to gradually reduce the area occupied by the sacrificial mask pattern and may include etching the sidewall of the sacrificial mask pattern horizontally. The horizontal etching may newly expose a part of the upper surface of the lower thin film structure 100 covered with the sacrificial mask pattern in the previous lower patterning, by expanding the region exposed by the sacrificial mask pattern horizontally. That is, exposed areas of the lower inter-layer insulating layers 120 and the lower sacrificial layers 130 may be expanded by performing the lower patterning repeatedly. The horizontal etching may be performed either by isotropic dry etching or by wet etching. In the horizontal etching, the upper surface of the sacrificial mask pattern may be etched together with the sidewall of the sacrificial mask pattern by performing slimming. The width and thickness of the sacrificial mask pattern may be reduced by repeating the lower patterning.

The vertical etching may include etching the lower inter-layer insulating layers 120 and the lower sacrificial layers 130 using the sacrificial mask pattern as an etching mask.

The cumulative number of lower patterning performed on the lower thin film structure 100 depends on the number of thin films laminated. Based on the difference in the cumulative number of lower patterning, as illustrated in FIGS. 1A through 1C, the lower thin film structure 100 may be formed to have the contact region with the terraced shape in the lower word line contact region LWCTR. That is, the end portions of the lower inter-layer insulating layers 120 and the lower sacrificial layers 130 may be located in the lower word line contact region LWCTR. By patterning the lower thin film structure 100 repeatedly, the end portions of the lower sacrificial layers 130 may be sequentially exposed. Therefore, the areas of the lower inter-layer insulating layers 120 and the lower sacrificial layers 130 may be decreased vertically from the substrate 10.

Subsequently, the sacrificial mask pattern may be removed, and then a lower insulating layer 160 may be formed so as to cover the lower thin film structure 100 in the lower word line contact region LWCTR. The lower insulating layer 160 may be formed of an insulating material having etching selectivity with respect to the lower sacrificial layers 130. For example, the lower insulating layer 160 may be formed of a silicon oxide material.

Figure 2A:
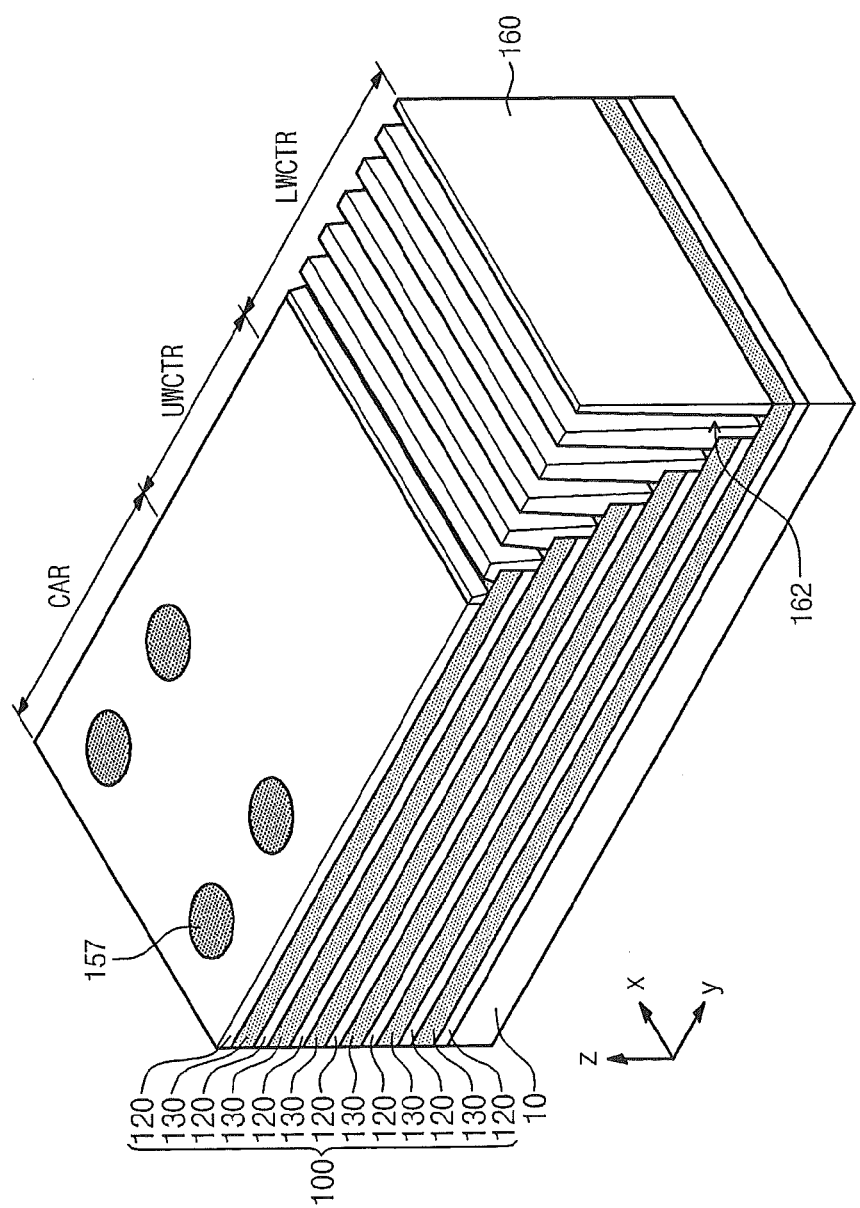
Figure 2B:
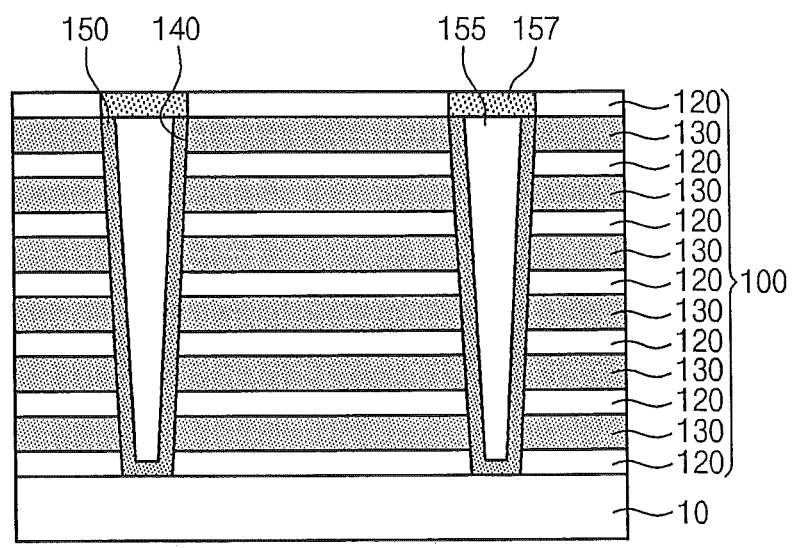
Figure 2C:
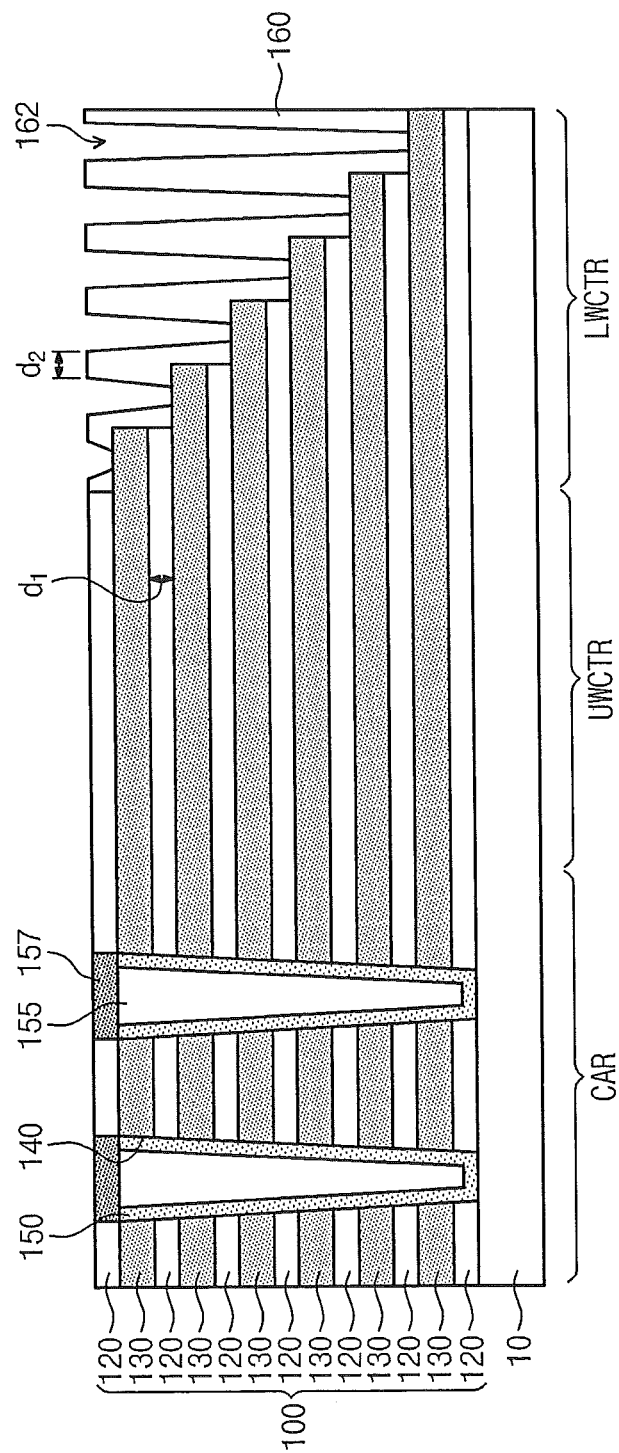

Referring to FIGS. 2A, 2B, and 2C, lower through-holes 140 are formed in the cell array region CAR to penetrate the lower thin film structure 100, and then lower semiconductor patterns 150 are formed in the lower through-holes 140.

The lower through-holes 140 are arranged two-dimensionally to expose the upper surface of the substrate 10 or an impurity region. As a consequence, lower semiconductor patterns 150 may be arranged two-dimensionally to come into direct contact with the upper surface of the substrate 10 or a lower conductive pattern.

Forming the lower through-holes 140 may include forming a mask pattern defining the positions of the lower through-holes 140 on the lower thin film structure 100 and etching the lower thin film structure 100 using the mask pattern as an etching mask. The etching of the lower thin film structure 100 may be performed by anisotropic etching. However, since the lower thin film structure 100 includes the plurality of layers, the lower through-holes 140 may be formed in a downwardly tapered shape, as illustrated. That is, the lower through-holes 140 may each have a width narrower in the lower portion than in the upper portion.

The forming of the lower semiconductor patterns 150 may include forming a lower semiconductor layer with which the lower through-holes 140 are filled and a node isolating step of etching the lower semiconductor layer to expose the upper surface of the lower thin film structure 100. The semiconductor layer forming step may be performed by an epitaxial technique and/or chemical vapor deposition. The node isolating step may be performed by chemical-mechanical planarization and an etch-back technique.

The lower semiconductor patterns 150 may be formed of one of semiconductor materials by an epitaxial technique and/or chemical vapor deposition. The crystalline structure may be one of a multi-crystalline structure, a single-crystalline structure, and an amorphous structure. The lower semiconductor patterns 150 may be formed in a cylindrical shape completely filling the lower through-holes 140 or in a hollow cylindrical shape substantially conformally covering the inner sidewalls of the lower through-holes 140 as shown in FIGS. 2B and 2C.

When the lower through-holes 140 are formed in the downwardly tapered shape, as described above, the lower semiconductor patterns 150 also have a downwardly tapered shape that is formed using the lower through-holes 140 as molds. That is, the lower semiconductor patterns 150 may each be formed so as to have a width narrower in the lower portion than in the upper portion, as illustrated. On the other hand, the horizontal cross-sections of the lower through-holes 140 and the lower semiconductor pattern 150 may be circular or oval.

When the lower semiconductor patterns 150 are formed in the hollow cylindrical shape, as illustrated in FIGS. 2A through 2C, buried patterns 155 may be formed to fill the insides of the lower semiconductor patterns 150. The buried patterns 155 may contain at least one of insulating materials. For example, the buried patterns 155 may be formed of a silicon oxide layer or insulating materials by an SOG technique.

A contact pad 157 may be formed on the upper regions of the buried pattern 155 and the lower semiconductor pattern 150. The contact pad 157 may be an impurity region doped with impurities of a conductive type different from that of the lower semiconductor pattern 150. The contact pad 157 may be a conductive layer that may come into ohmic contact with the lower semiconductor pattern 150.

After the lower semiconductor patterns 150 are formed, hydrogen annealing may be further performed to process the product, in which the lower semiconductor patterns 150 are formed, under a gas atmosphere containing hydrogen and/or heavy hydrogen. The hydrogen annealing may cure crystal defects existing in the lower semiconductor patterns 150.

According to first embodiments of inventive concepts, the lower thin film structure 100 is patterned with the terraced shape before the lower semiconductor patterns 150 are formed. However, according to other embodiments, the lower thin film structure 100 may be patterned with the terraced shape in the lower word line contact region LWCTR, after the lower semiconductor patterns 150 are formed.

Subsequently, contact openings 162 are formed in the lower insulating layer 160, as illustrated in FIGS. 2A, 2B, and 2C.

Specifically, the forming of the contact openings 162 may include forming a mask pattern (not illustrated) on the lower insulating layer 160 of the lower word line contact region LWCTR to define positions of the contact openings 162 and etching the lower insulating layer 160 using the mask pattern as an etching mask.

The line-shaped mask pattern may be formed to define the positions of the contact openings 162. In this way, the contact openings 162 may have a line-shaped plane.

The etching of the lower insulating layer 160 may be performed by anisotropic etching. Therefore, the contact opening 162 may expose the upper surface of the lower sacrificial layer 130 in the lower word line contact region LWCTR. The contact openings 162 may have a width narrower in the lower portion than in the upper portion. In the patterning of the lower insulating layer 160, an etching depth of the lower insulating layer 160 in the anisotropic etching is thinner than the height of the lower thin structure 100.

On the other hand, since the lower thin film structure 100 has the terraced shape in the lower word line contact region LWCTR, the respective contact openings 162 are formed so as to expose the lower sacrificial layers 130 located at different heights from the substrate 10. That is, the contact openings 162 different in the etching depth are formed in the lower word line contact region LWCTR. In order to form these contact openings 162, the lower insulating layer 160 may be patterned as an additional step. That is, the lower sacrificial layers 130 formed at the different heights may be exposed by the contact openings 162 formed simultaneously in the same step.

The contact openings 162 may each expose the upper surface of the lower sacrificial layer 130 at the position spaced from one-sidewall of the lower sacrificial layer 130 at a predetermined distance. Since the lower thin film structure 100 has the laminated configuration in which the adjacent one-sidewalls of the lower sacrificial layers 130 are spaced from each other at a predetermined distance, one contact opening 162 may be formed between the one-sidewalls of the lower sacrificial layers 130 vertically adjacent to each other.

Since the lower contact openings 162 are formed by patterning the lower insulating layer 160, a distance $d_2$ between the lower contact openings 162 may be larger than a distance $d_1$ between the lower sacrificial layers 130. The distance between the lower contact openings 162 may be different depending on the distance between the one-sidewalls of the lower sacrificial layers 130 vertically adjacent to each other.

Figure 3A:
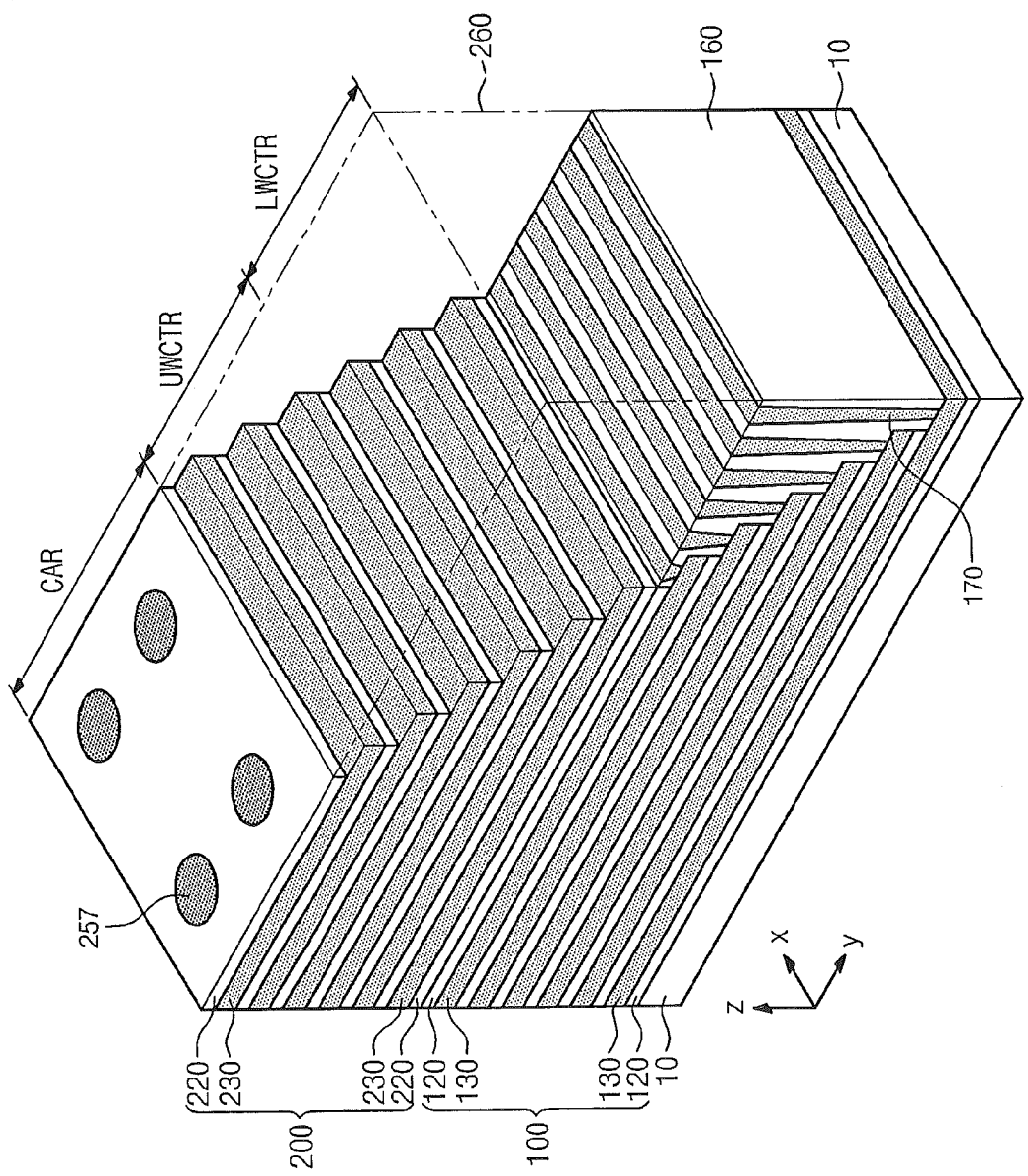
Figure 3B:
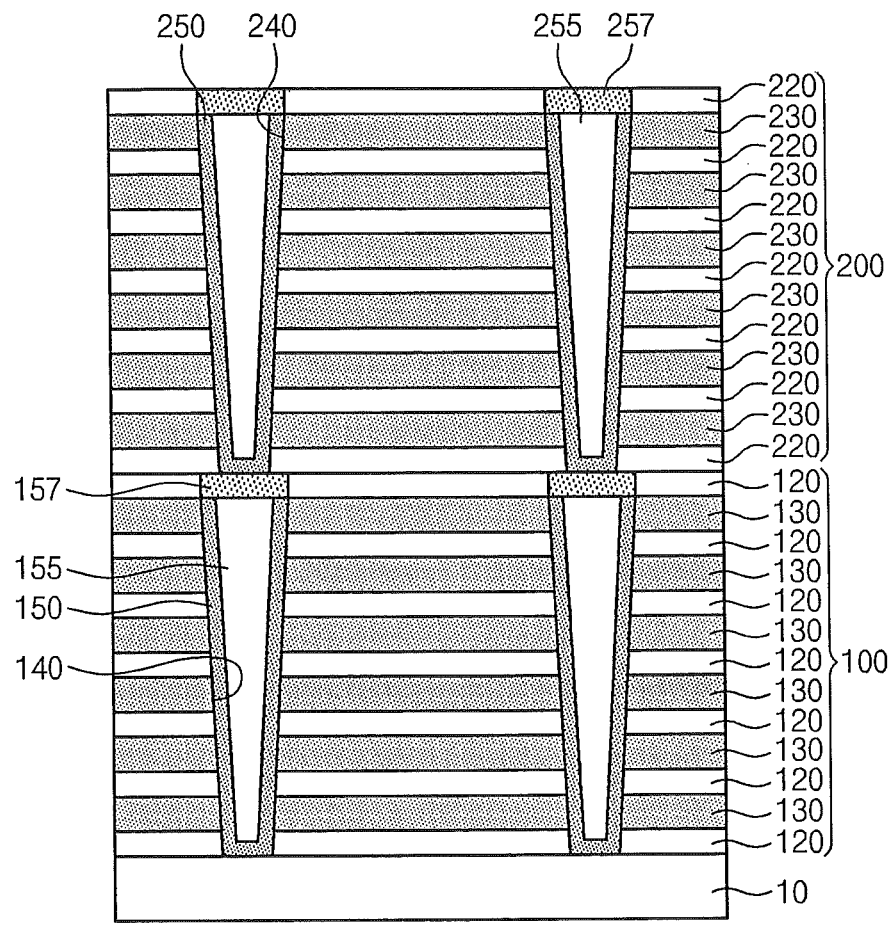

Referring to FIGS. 3A, 3B, and 3C, lower sacrificial contact patterns 170 are formed by burying a sacrificial material in the contact openings 162. The burying of the sacrificial material in the contact openings 162 includes depositing the same material as that of the lower sacrificial layers included in the lower thin film structure 100 and performing planarization until the upper portion of the lower insulating layer 160 is exposed. In this way, the lower sacrificial contact patterns 170 may be formed in the lower word line contact region LWCTR so as to have the line-shaped horizontal configuration and have depths different from each other. That is, the lower sacrificial contact patterns 170 may be formed to correspond to the lower sacrificial layers 130 laminated in the terraced shape. The thicknesses of the lower sacrificial contact patterns 170 are decreased as the lower sacrificial contact patterns 170 are closer to the cell array region CAR.

Subsequently, an upper thin film structure 200 and upper semiconductor patterns 250 are formed on the product in which the lower semiconductor patterns 150 and the lower sacrificial contact patterns 170 are formed.

The upper thin film structure 200 may include a plurality of upper inter-layer insulating layers 220 and a plurality of upper sacrificial layers 230. The upper thin film structure 200 may be formed in the same way as that of the lower thin film structure 100. That is, the upper inter-layer insulating layers 220 and the upper sacrificial layers 230 may be formed in the same way as that of the lower inter-layer insulating layers 120 and the lower sacrificial layers 130 in terms of at least one of the material, the thickness, and the forming methods. According to a modified example, however, the upper inter-layer insulating layers 220 and the upper sacrificial layers 230 may be different from the lower inter-layer insulating layers 120 and the lower sacrificial layers 130 in terms of at least one of the material, the thickness, and the forming methods. The upper thin film structure 200 may be different from the lower thin film structure 100 in the number of thin films of the structure.

After the upper thin film structure 200 is formed, the upper thin film structure 200 is patterned to form a contact region with a terraced shape in an upper word line contact region UWCTR.

Specifically, a sacrificial mask pattern (not illustrated) is formed on the upper thin film structure 200, and then the upper thin film structure 200 is patterned to form the contact region with the terraced shape.

As described with reference to FIGS. 1A through 1C, the patterning of the upper thin film structure 200 may include performing exhaustive etching by using the sacrificial mask pattern as an exhaustive etching mask. Specifically, the exhaustive etching includes a plurality of lower patterning. The lower patterning may include horizontal etching and vertical etching.

The horizontal etching may be performed to gradually reduce the area occupied by the sacrificial mask pattern and may include etching the sidewall of the sacrificial mask pattern horizontally. The vertical etching may include etching the upper inter-layer insulating layers 220 and the upper sacrificial layers 230 using the sacrificial mask pattern as an etching mask.

The cumulative number of patterning on the upper thin film structure 200 depends on the number of thin films laminated. As illustrated in FIGS. 3A through 3C, the upper thin film structure 200 may have a terraced shape in the upper word line contact region UWCTR. By patterning the upper thin film structure 200 repeatedly, the surfaces of the lower insulating layer 160 and the lower sacrificial contact patterns 170 may be exposed.

According to other embodiments, the upper thin film structure 200 may be patterned and the contact region with the terraced shape may be formed in the upper word line contact region UWCTR, after the upper semiconductor patterns 250 are formed in the upper thin film structure 200.

Subsequently, after the upper thin film structure 200 is patterned, an upper insulating layer 260 is formed to cover the upper thin film structure 200 in the upper word line contact region UWCTR and the lower word line contact region LWCTR.

The upper semiconductor patterns 250 may be formed by patterning using a same photo mask pattern as that of the lower semiconductor patterns 150 as an etching mask. Specifically, upper through-holes 240 may be formed above the lower through-holes 140, respectively, to define the positions of the upper semiconductor patterns 250. The upper semiconductor patterns 250 may be aligned and laminated on the lower semiconductor patterns 150.

The upper semiconductor patterns 250 may be formed in the same method used to form lower semiconductor patterns 150. Specifically, the upper semiconductor patterns 250 may be formed in the semiconductor layer forming step and the node isolating step described with reference to FIGS. 2A through 2C. Therefore, the upper semiconductor pattern 250 may be the same as the lower semiconductor pattern 150 in at least one of shape, material, and/or crystalline structure. For example, as illustrated, the upper semiconductor patterns 250 may also be formed in the downwardly tapered shape. In this case, the area of the bottom surface of the upper semiconductor pattern 250 may be larger than that of the upper surface of the lower semiconductor pattern 150.

According to a modification of the inventive concept, at least one intermediate thin film structure and intermediate semiconductor patterns may be formed, before the upper thin film structure 200 and the upper semiconductor patterns 250 are formed. The intermediate thin film structure and the intermediate semiconductor patterns may be formed in the same way as the method of forming one of the lower thin film structure 100 and the upper thin film structure 200 and at least one of the lower semiconductor pattern 150 and the upper semiconductor pattern 250, or a modified method.

Figure 4A:
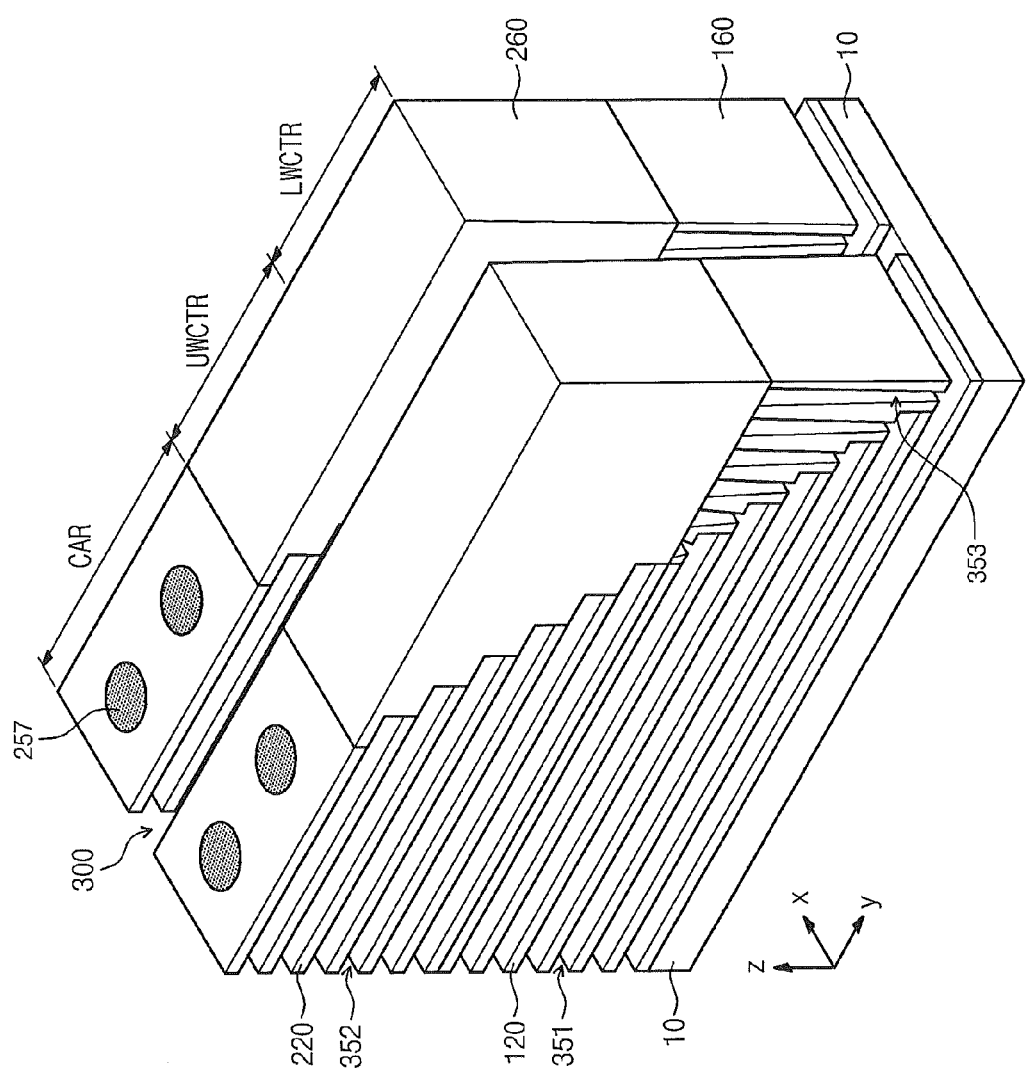
Figure 4B:
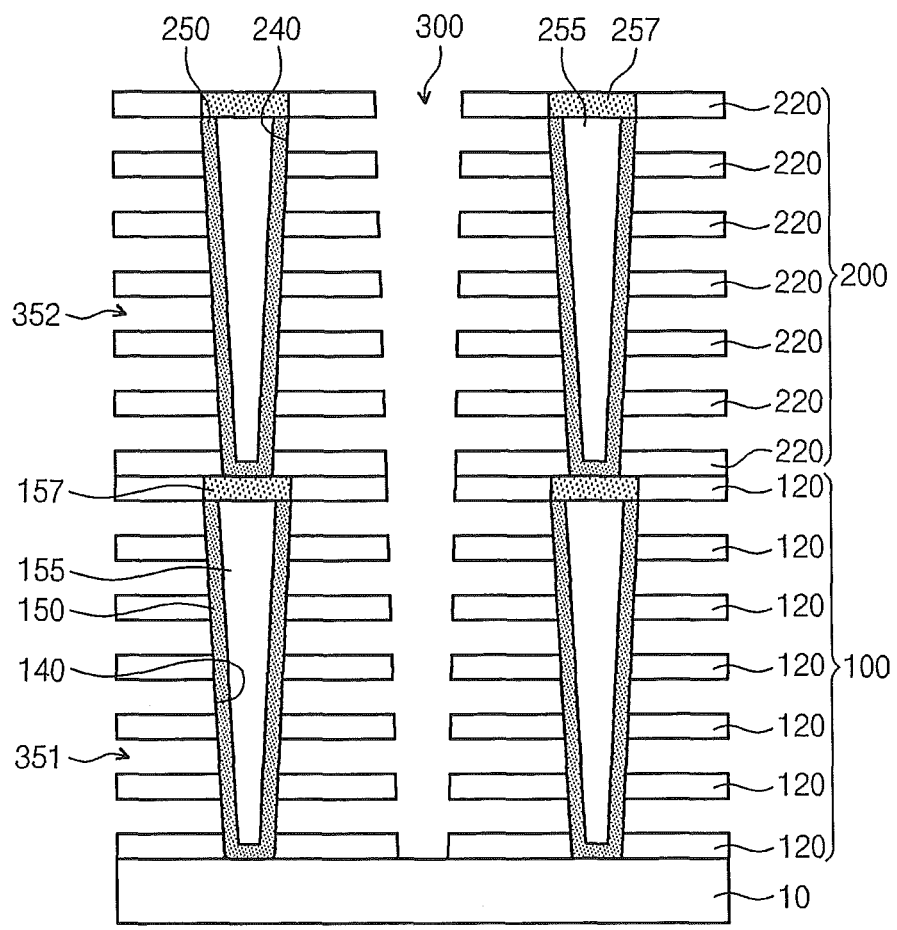

Referring to FIGS. 4A, 4B, and 4C, trenches 300 are formed between the upper semiconductor patterns 250 so as to penetrate the lower thin film structure 100 and the upper thin film structure 200. The trenches 300 may be formed to be spaced from the lower semiconductor patterns 150 and the upper semiconductor patterns 250. The trenches 300 expose the sidewalls of the lower sacrificial layers 130, the upper sacrificial layers 230, the lower inter-layer insulating layers 120, and the upper inter-layer insulating layers 220.

The trenches 300 may intersect the cell array region CAR, the upper word line contact region UWCTR, and the lower word line contact region LWCTR. In this case, the lower thin film structure 100 and the upper thin film structure 200 may be divided into at least two configurations. The trenches 300 may intersect the lower sacrificial contact patterns 170 with a line-shaped plane. That is, the line-shaped lower sacrificial contact patterns 170 may be patterned, when the trenches 300 are formed. Therefore, the lower sacrificial contact patterns 170 may have a horizontal cross-section of a rectangular shape. The sidewalls of the lower sacrificial contact patterns 170 may be exposed.

The trenches 300 may be formed by one-time patterning to penetrate the plurality of thin film structures (for example, the lower thin film structure 100 and the upper thin film structure 200) formed by at least two distinct processes. For example, as described above, the step may be further performed to form the intermediate thin film structure, the through-holes penetrating the intermediate thin film structure, and the semiconductor patterns between the lower thin film structure 100 and the upper thin film structure 200.

When viewed from the vertical cross-section, the width of the upper portion (which is a portion adjacent to the upper surface of the upper thin film structure 200) of the trench 300 may be broader than the width of the lower portion (which is a portion adjacent to the substrate 10) of the trench 300. That is, according to the above-described embodiment, the trench 300 may be formed so as to have the downwardly tapered shape.

When viewed from horizontal plane, the line-shaped trenches 300 may be formed. Specifically, the trenches 300 may be formed to have a length longer than the sum of the widths of the plurality of upper semiconductor patterns 250 and a width shorter than the sum thereof.

According to a modified example of the inventive concept, the trenches 300 may penetrate all of the thin films of the upper thin film structure 200 and some of the thin films of the lower thin film structure 100. For example, the trenches 300 may not penetrate the lowermost thin film of the lower thin film structure 100 to expose the upper surface of the lowermost thin film.

Subsequently, upper recess regions 352, lower recess regions 351, and contact recess regions 353 are formed by selectively removing the upper sacrificial layers 230, the lower sacrificial layers 130, and the lower sacrificial contact patterns 170 of which the sidewalls are exposed by the trenches 300.

The upper recess region 352 and the lower recess region 351 may be gap regions extending horizontally from the trench 300 to spaces between upper inter-layer insulating layers 220 and the lower inter-layer insulating layers 120, respectively. The upper recess region 352 and the lower recess region 351 may be formed so as to expose the sidewalls of the upper semiconductor pattern 250 and the lower semiconductor pattern 150.

The contact recess regions 353 may be empty spaces in which the lower sacrificial contact patterns 170 are removed in the lower insulating layer 160. The contact recess regions 353 may be connected to the lower recess regions 351.

The forming of the upper recess regions 352, the lower recess regions 351, and the contact recess regions 353 may include isotropic etching performed on the upper sacrificial layers 230 and the lower sacrificial layers 130 using an etching recipe having etching selectivity with respect to the upper inter-layer insulating layers 220 and the lower inter-layer insulating layers 120. Since the lower sacrificial contact patterns 170 come into contact with the lower sacrificial layers 130 and are formed of the same material, the lower sacrificial contact patterns 170 may be removed together upon removing the upper sacrificial layers 230 and the lower sacrificial layers 130.

For example, when the upper sacrificial layers 230, the lower sacrificial layers 130, and the lower sacrificial contact patterns 170 are silicon nitride layers and the upper inter-layer insulating layers 220 and the lower inter-layer insulating layers 120 are silicon oxide layers, the etching may be performed using an etchant containing phosphoric acid. According to the embodiments of the inventive concept, the upper recess regions 352 and the lower recess regions 351 may substantially be formed with the contact recess regions 353 at the same time.

Figure 5A:
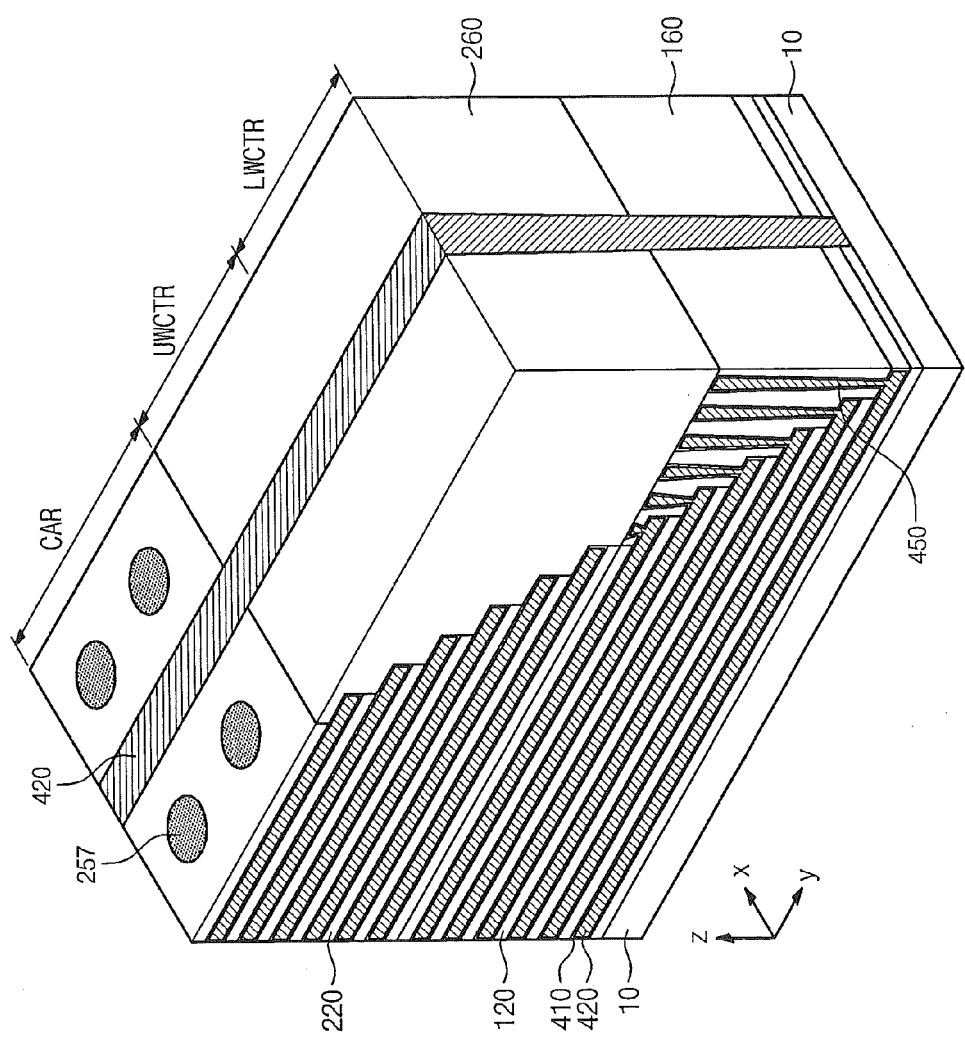
Figure 5B:
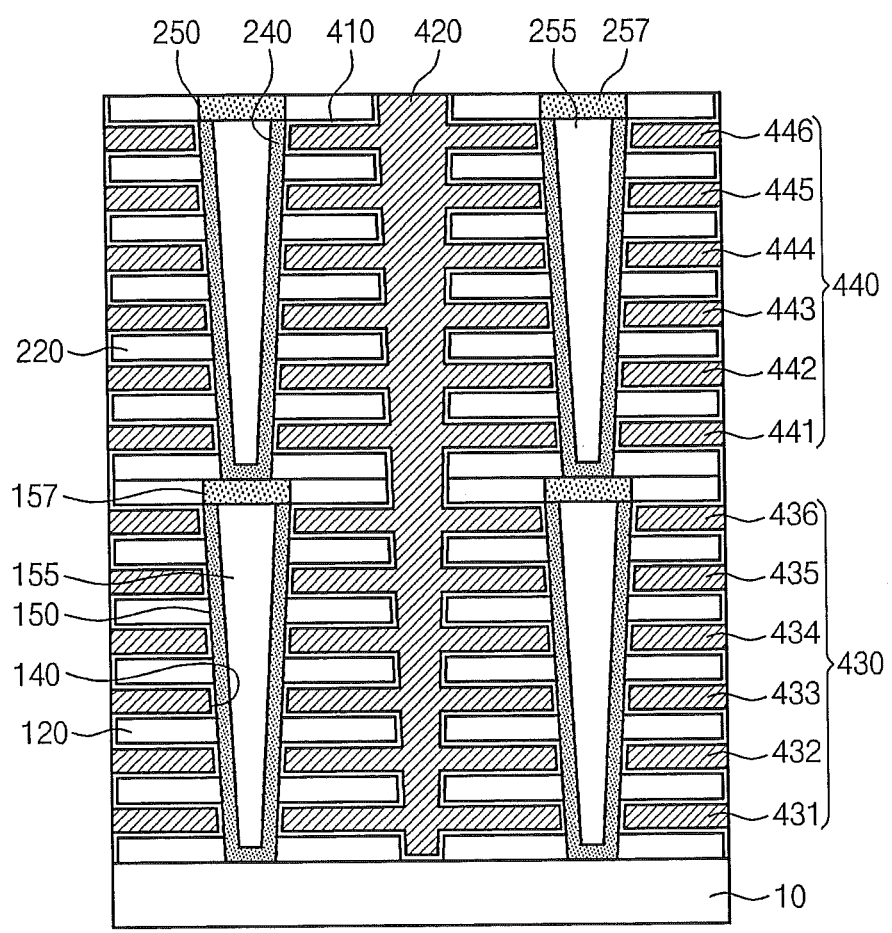

Referring to FIGS. 5A, 5B, and 5C, an information storing layer 410 and a conductive layer 420 are sequentially formed in the upper recess regions 352, the lower recess regions 351, and the contact recess regions 353.

The information storing layer 410 may be formed using a deposition technique (for example, chemical vapor deposition and/or atomic layer deposition) capable of providing good step coverage. The information storing layer 410 may be formed to have a thickness thinner than the half of the thickness of the upper recess region 352 and the lower recess region 351. In this way, the information storing layer 410 may substantially be formed to conformally cover the product in which the upper recess regions 352, the lower recess regions 351, and the contact recess regions 353 are formed.

More specifically, the information storing layer 410 may be formed on the surface of the insulating layers exposed to the upper recess regions 352, the lower recess regions 351, and the contact recess regions 353. The information storing layer 410 may successively extend from the lower recess regions 351 to the contact recess regions 353. Moreover, the information storing layer 410 may be formed to wrap around the circumferences of the lower semiconductor patterns 150 and the upper semiconductor patterns 250.

According to some embodiments of inventive concepts for a flash memory, the information storing layer 410 may include a charge storing layer. For example, the information storing layer 410 may include one of a trap insulating layer and an insulating layer with a floating gate electrode or conductive nano dots. According to an embodiment of the inventive concept, the information storing layer 410 may further include a tunnel insulating layer and a blocking insulating layer.

The conductive layer 420 may be formed to fill the trenches 300, the upper recess regions 352, the lower recess regions 351, and the contact recess regions 353 covered with the information storing layer 410. The conductive layer 420 may contain at least one of a doped polysilicon, metal layers, metal nitride layers, and/or metal silicides.

On the other hand, since inventive concepts are applied to memory types other than flash memory devices, the information storing layer 410 and the conductive layer 420 may be modified in various forms in terms of materials and structures.

Figure 6A:
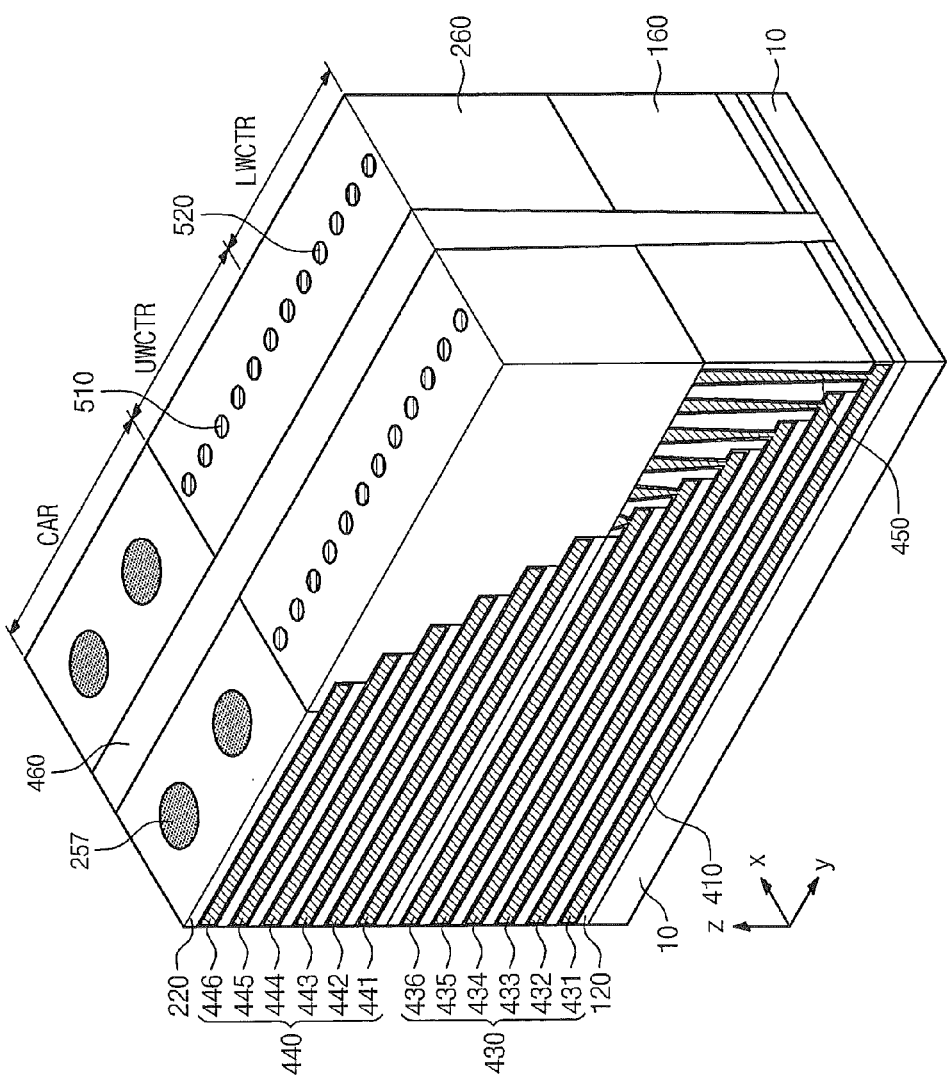
Figure 6B:
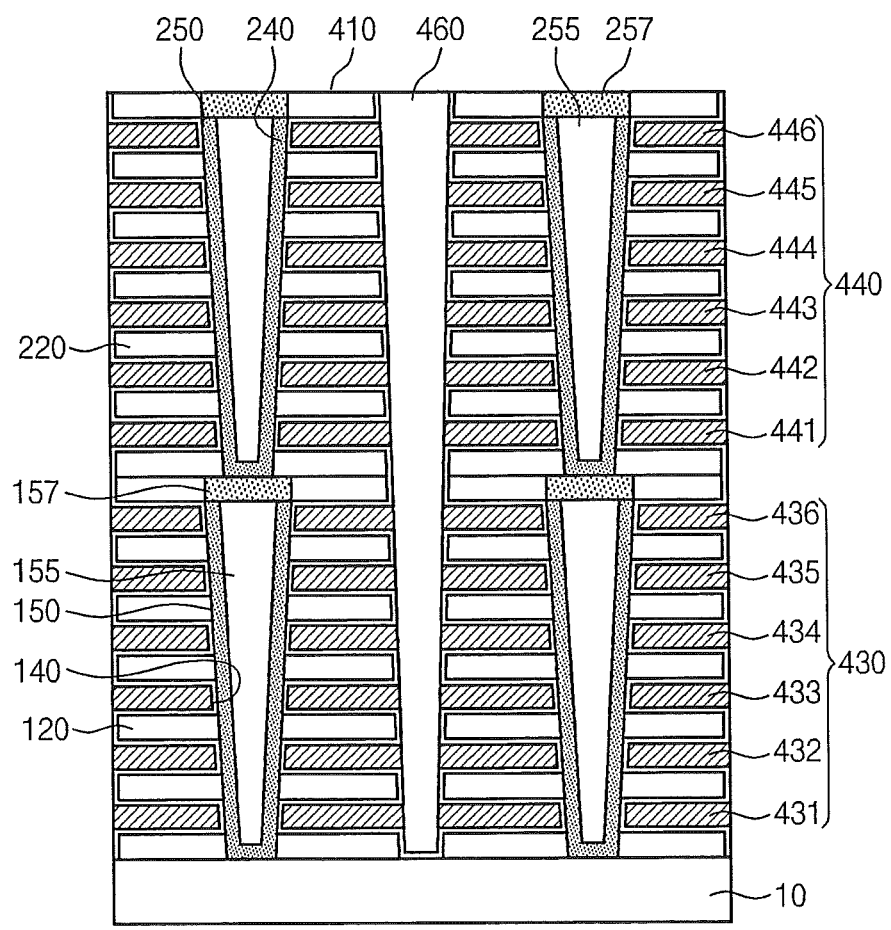
Figure 6C:
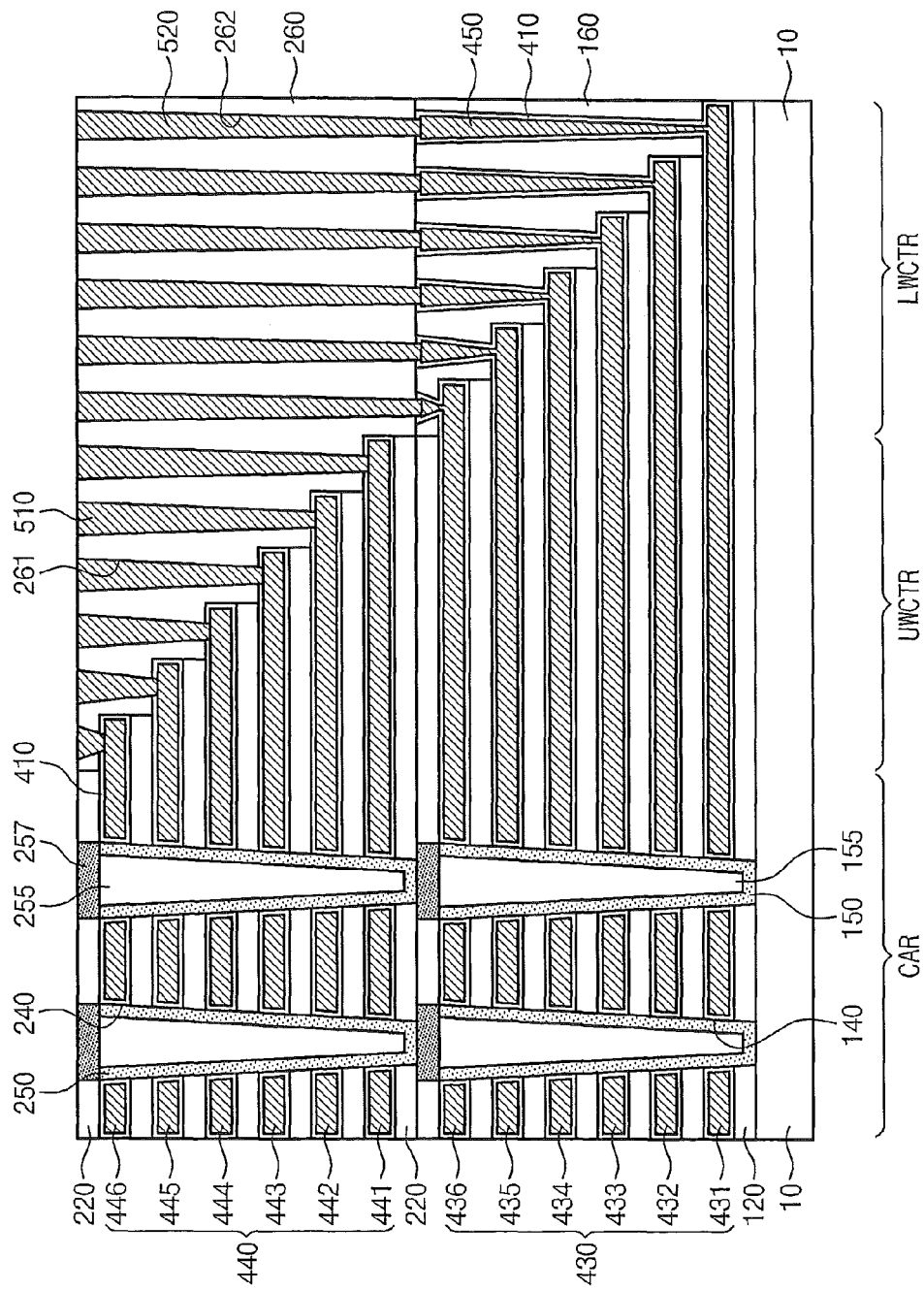
Figure 7:
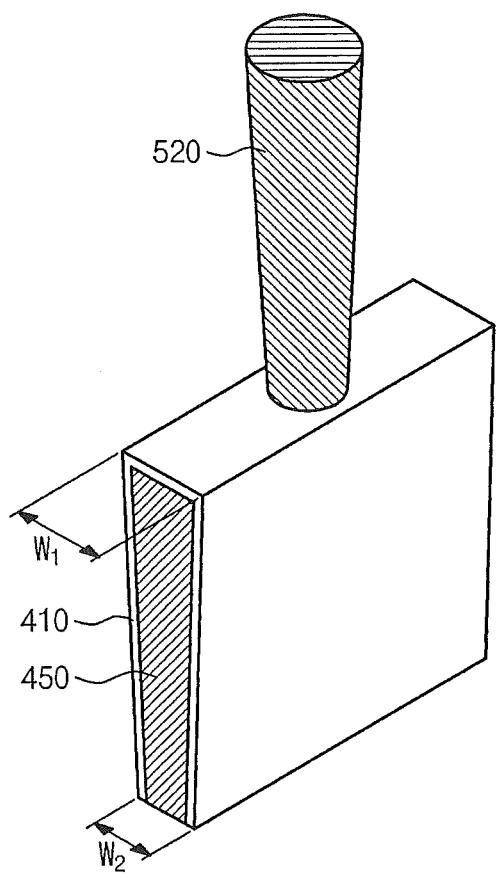
FIG. 7 is a perspective view illustrating a contact structure of the three-dimensional semiconductor device according to first embodiments of inventive concepts.

Referring to FIGS. 6A, 6B, and 6C, by removing the conductive layer 420 in the trench 300, lower conductive patterns 430 (431 to 436) and upper conductive patterns 440 (441 to 446) are formed in the upper recess regions 352, and the lower recess regions 351 and buried contact plugs 450 are formed in the contact recess regions 353. The lower conductive patterns 430, the upper conductive patterns 440, and the buried contact plugs 450 are formed of the same conductive material, since they are formed simultaneously.

The removing of the conductive layer 420 in the trench 300 may include anisotropically etching the conductive layer 420 using a mask pattern (not illustrated) additionally formed in or above the uppermost upper inter-layer insulating layer 220 of the upper thin film structure 200 as an etching mask. When the conductive layer 420 in the trench 300 is removed, the conductive layer 420 is vertically divided to form the lower conductive patterns 430, the upper conductive patterns 440, and the buried contact plugs 450.

That is, the lower conductive patterns 430 and the upper conductive patterns 440 may be formed locally in the lower recess regions 351 and the upper recess regions 352, respectively, and may form a lower wiring structure 430 and an upper wiring structure 440, respectively. Moreover, the buried contact plugs 450 are locally formed in the contact recess region 353 to be connected to the lower conductive patterns 430, respectively. The buried contact plugs 450 formed in the contact recess region 353 may have a horizontal configuration of a rectangular shape and the sidewalls thereof may be exposed to the trench 300.

The buried contact plugs 450 may be connected one-to-one to respective lower conductive patterns 430 and may be formed at different heights depending on the layers in which the lower conductive patterns 430 are disposed. Moreover, since the buried contact plugs 450 are formed simultaneously with the lower conductive patterns 430, no boundary is formed between the buried contact plugs 450 and the lower conductive patterns 430. That is, the buried contact plugs 450 and the lower conductive patterns 430 may form one conductive pattern formed of the same material.

Subsequently, an isolation insulating pattern 460 is formed to fill the trench 300. The forming of the isolation insulating pattern 460 may include filling the trench 300, of which the conductive layer is removed, with at least one insulating material. Therefore, the sidewalls of the lower conductive patterns 430, the upper conductive patterns 440, and the buried contact plugs 450 may come into contact with the isolation insulating pattern 460. According to some embodiments of inventive concepts, the isolation insulating pattern 460 may be at least one of a silicon oxide layer, a silicon nitride layer, and/or a silicon oxynitride.

After the isolation insulating pattern 246 is formed, as illustrated in FIGS. 6A through 6C, upper contact plugs 510 are formed to be connected to the upper conductive patterns 440, and lower contact plugs 520 are formed to be connected to the buried contact plugs 450.

The forming of the upper contact plugs 510 and the lower contact plugs 520 includes forming contact holes 261 and 262 in the upper insulating layer 260 and burying a conductive material in contact holes 261 and 262.

Specifically, the forming of the contact holes 261 and 262 may include: forming a mask pattern (not illustrated) defining positions of the contact holes 261 and 262 on the upper insulating layer 260 covering the lower word line contact region LWCTR and the upper word line contact region UWCTR; and etching the upper insulating layer 260 using the mask pattern as an etching mask.

forming the contact holes 261 and 262 may include forming the lower contact holes 262 to expose respective buried contact plugs 450 and forming the upper contact holes 261 to expose respective upper conductive patterns 440.

Since the upper thin film structure 200 is formed to have the contact region with the terraced shape in the upper word line contact region UWCTR, the patterning of the upper insulating layer 260 may be repeated to expose the upper conductive patterns 440 formed at different distances from the substrate 10. The contact holes formed simultaneously in the same patterning may expose the upper conductive patterns 440 formed at the same height.

The etching of the upper insulating layer 260 may be performed by anisotropic etching. In this case, the contact holes 261 and 262 may be formed in downwardly tapered shape. That is, the contact holds 261 and 262 may be formed to have a width narrower in the lower portion than in the upper portion.

In the anisotropic etching, the portions of information storing layer 410 formed on the buried contact plugs 450 and the upper conductive patterns 440 are removed locally to expose the upper conducive patterns 440 and the buried contact plugs 450 by over etch.

Subsequently, the upper contact plugs 510 and the lower contact plugs 520 may be formed by burying a conductive material in the contact holes formed in the upper insulating layer 260. That is, in the upper word line contact region UWCTR, the upper contact plugs 510 may be formed to be connected to the upper conductive patterns 440. In the lower word line contact region LWCTR, the lower contact plugs 520 may be formed to be connected to the buried conductive plugs 450. In this way, the upper contact plugs 510 and the lower contact plugs 520 may be formed in a cylindrical shape in the contact holes.

After the upper contact plugs 510 and the lower contact plugs 520 are formed, bit lines may be formed to be connected to the upper semiconductor pattern 250, and global word lines GWL may be formed to be connected to the upper contact plugs 510 and the lower contact plugs 520.

The bit lines may intersect the isolation insulating pattern 460 or the upper conductive patterns 430 and the upper conductive patterns 440. The global word lines may be parallel to the bit lines. The global word lines electrically connect the upper contact plugs 510 and the lower contact plugs 520 connected to the conductive patterns formed at the same height. The bit lines and the global word lines may be connected electrically to the upper semiconductor patterns 250 and the contact plugs 510 and 520 by additional contact plugs.

Hereinafter, the three-dimensional semiconductor device manufactured according to first embodiments of inventive concepts will be described with reference to FIGS. 6 and 7.

The three-dimensional semiconductor device includes the lower wiring structure 430 and the upper wiring structure 440 laminated on a substrate 10. The lower wiring structure 430 includes the laminated lower conductive patterns 431 to 436. The upper wiring structure 440 includes the laminated upper conductive patterns 441 to 446.

The lower wiring structure 430 has a terraced structure in the lower word line contact region LWCTR. The upper wiring structure 440 has a terraced structure in the upper word line contact region UWCTR. That is, the areas of the conductive patterns may be reduced in order of the lower conductive patterns 431 to 436 and the upper conductive patterns 441 to 446 laminated on the substrate 10. As the lower conductive patterns 431 to 436 and the upper conductive patterns 441 to 446 are more distant from the substrate 10, the distance between the cell array region CAR and -sidewalls of the conductive patterns may be reduced.

In the cell array region CAR, the lower semiconductor patterns 150 are disposed to penetrate the lower wiring structure 430, and the upper semiconductor patterns 250 are disposed to penetrate the upper wiring structure 440 and to be connected to the lower semiconductor patterns 150.

In the lower word line contact region LWCTR, the end portions of the lower conductive patterns 430 are disposed, the buried contact plugs 450 are disposed to be electrically connected to the lower conductive patterns 430, and the lower contact plugs 520 are disposed to come into direct contact with the upper surfaces of the buried contact plugs 450. In the upper word line contact region UWCTR, the end portions of the upper conductive patterns 440 are disposed and the upper contact plugs 510 are disposed to be electrically connected to the upper conductive patterns 440.

The information storing layer 410 is disposed between the lower and upper conductive patterns 430 and 440 and the lower and upper semiconductor patterns 150 and 250. The information storing layer 410 may extend to the upper surfaces and the bottom surfaces of the lower conductive patterns 430 and the upper conductive patterns 440. The information storing layer 410 covering the lower conductive patterns 430 may extend between the buried contact plug 450 and the lower insulating layer 160.

Since the buried contact plugs 450 are formed simultaneously with the lower conductive patterns 430, as described above, the buried contact plugs 450 may extend continuously from the lower conductive pattern 430. That is, the lower conductive patterns 430 and the buried contact plugs 450 may be formed of the same conductive material. No boundary is formed between the lower conductive patterns 430 and the buried contact plugs 450.

The buried contact plugs 450 may each be formed between sidewalls of the lower insulating layer 160 vertically adjacent to each other. Therefore, the lower conductive patterns 430 may protrude more than the buried contact plugs 450 and may each have a protrusion portion parallel to the substrate 10. That is, the protrusion portion of the lower conductive pattern 430 is more distant from the cell array region CAR than the buried contact plug 450.

The buried contact plugs 450 may have a substantial hexahedron shape. That is, the buried contact plugs 450 may have a horizontal cross-section of a substantially rectangular shape. In this case, the length of one of two sides defining the horizontal cross-section of the rectangular shape may substantially be the same as the width of the lower conductive pattern 430. In the buried contact plugs 450, a lower width W2 may be less than a upper width W1. The thickness of the buried contact plugs 450 may decrease as the distance between the buried contact plugs 450 and the cell array region CAR is reduced. Distances between the buried contact plugs 450 may be greater than distances between the conductive patterns 431 to 436 and 441 to 446.

Since the lower insulating layer 160 and the isolation insulating patterns 460 are formed around the circumferences of the buried contact plugs 450, the adjacent buried contact plugs 450 are isolated electrically from each other. The information storing layer 410 may be formed on both sidewalls of the buried contact plugs 450 adjacent to the lower insulating layer 160.

On the other hand, the upper contact plugs 510 disposed in the upper word line contact region UWCTR may have a substantially cylindrical shape. The lower contact plugs 520 connected to the buried contact plugs 450 may also have a substantially cylindrical shape. The upper contact plugs 510 and the lower contact plugs 520 may have a width that decreases with depth into upper insulating layer 260. A minimum width of each lower contact plug 520 may be smaller than an upper width of the respective buried contact plug 450 disposed below the lower contact plug 520. Since the information storing layer 410 is formed to cover the upper surfaces of the upper conductive patterns 440 and the upper surfaces of the buried contact plugs 450, the upper contact plugs 510 and the lower contact plugs 520 may penetrate the information storing layer 410 to come into contact with upper surfaces of upper conductive patterns 440 and upper surfaces of buried contact plugs 450.

Figure 8:
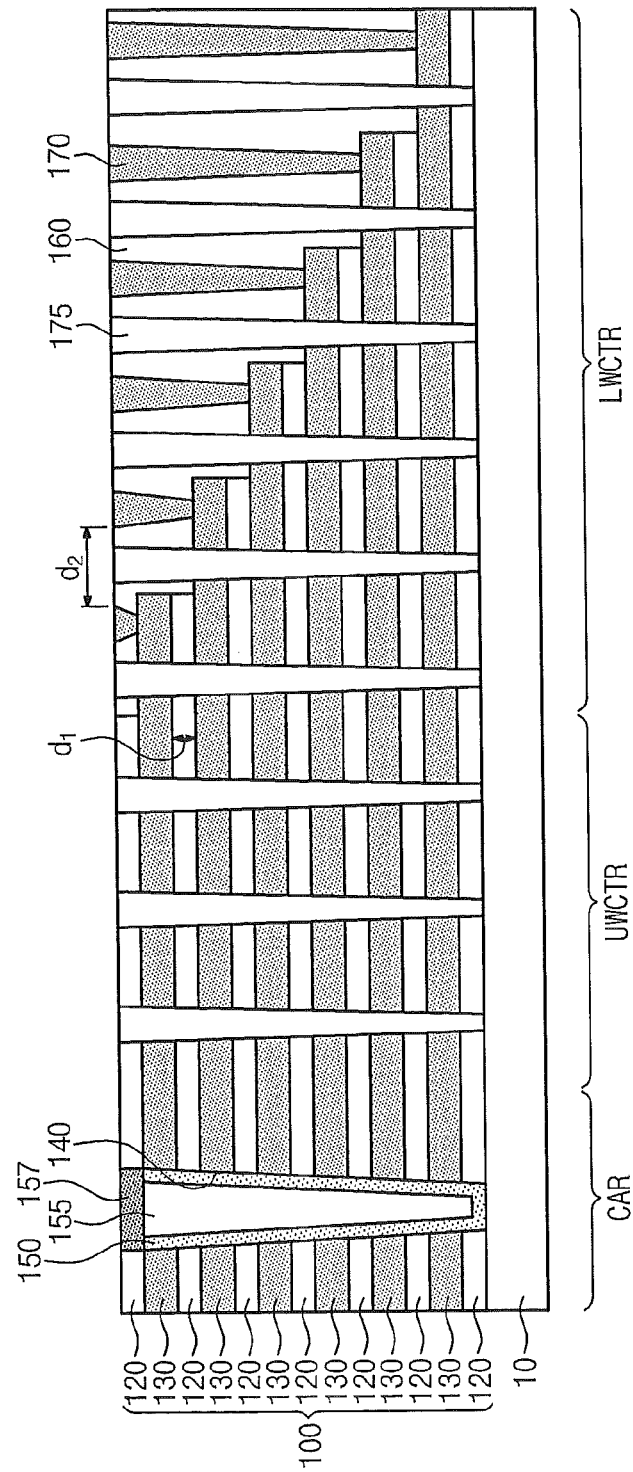
FIGS. 8 and 9 are cross sectional views illustrating methods of manufacturing a three-dimensional semiconductor device according to a modification of the first embodiments of inventive concepts.
Figure 9:
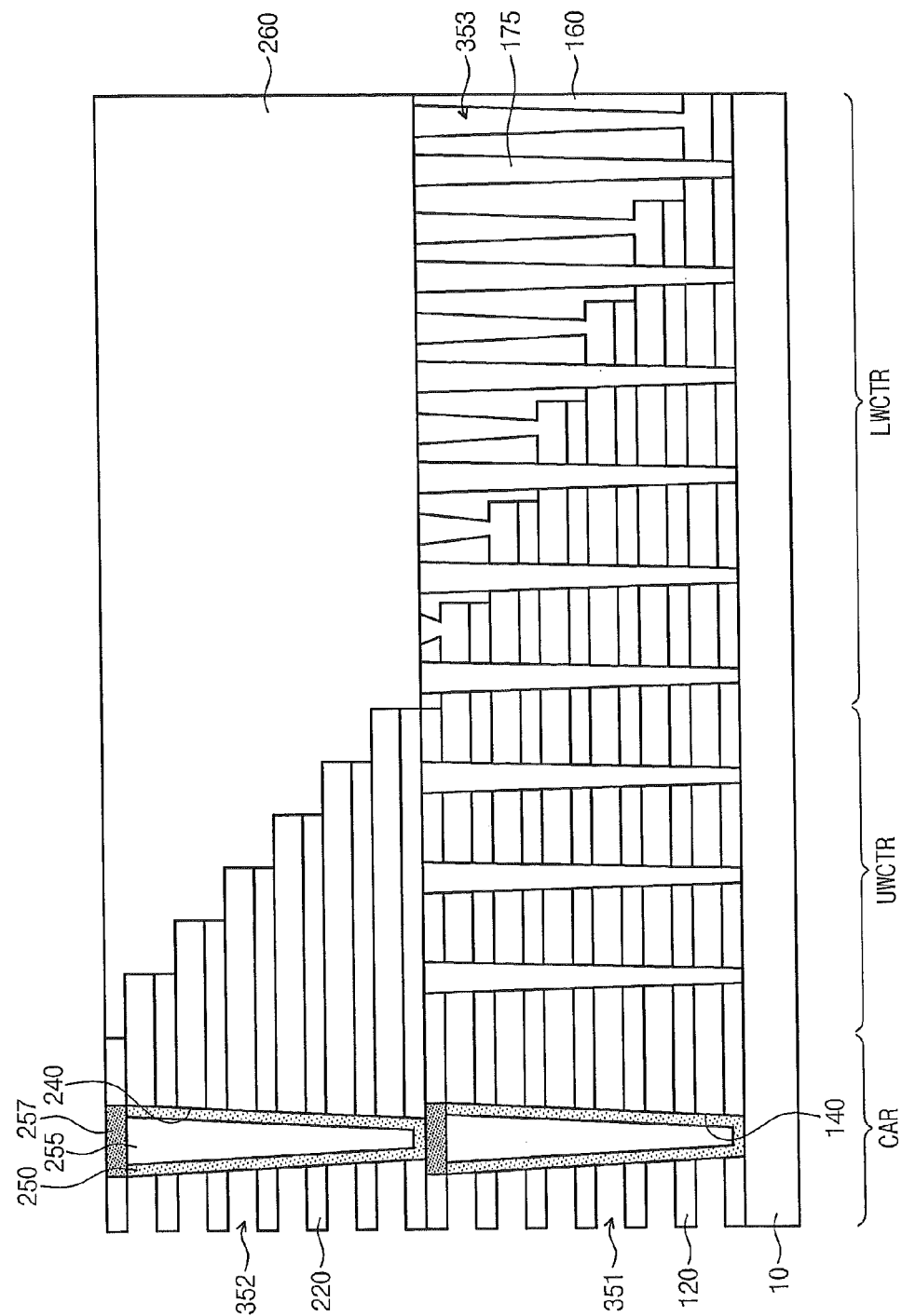

FIGS. 8 and 9 are diagrams illustrating a method of manufacturing a three-dimensional semiconductor device according to a modified example of first embodiments of inventive concepts.

Referring to FIG. 8, supporting members 175 may be formed in the lower word line contact region LWCTR to support the lower thin film structure 100, before or after the lower sacrificial contact patterns 170 are formed in first embodiments of inventive concepts.

The supporting members 175 are formed perpendicular to the substrate 10 and may be formed to penetrate the lower thin film structure 100 in the lower word line contact region LWCTR. One or more supporting members 175 may be formed and may be formed of a non-conductive material having etching selectivity with respect to the lower sacrificial layers 130 and the lower sacrificial contact patterns 170. For example, the supporting members 175 may be formed of the same material as that of the lower inter-layer insulating layers 120 or the lower insulating layer 160. The supporting members 175 may be formed together with the lower semiconductor patterns 150 so as to be formed of a semiconductor material.

The supporting members 175 may be formed between the lower sacrificial contact patterns 170 to penetrate the lower thin film structure 100. The supporting members 175 may prevent and/or reduce collapse of the lower inter-layer insulating layers 120 and the lower insulating layers 160 in the subsequent process of removing the lower sacrificial layers 130.

According to the modified example, since the sacrificial contact pattern 170 and the supporting member 175 are disposed between the one-sidewalls of the lower sacrificial layers 130 vertically adjacent to each other, the distance $d_2$ between the sacrificial contact patterns 170 may be larger than that of first embodiments of inventive concepts.

Referring to FIG. 9, when the supporting members 175 are formed in the lower word line contact region LWCTR and the upper word line contact region UWCTR, the supporting members 175 may remain when forming the recess regions 351 to 353 due to the fact that the supporting members 175 have the etching selectivity with respect to the lower sacrificial layers 130. That is, when the recess regions 351 to 353 are formed, the supporting members 175 may penetrate the recess regions 351. The supporting members 175 may maintain distance between the lower inter-layer insulating layers 120. That is, the supporting members 175 may prevent and/or reduce collapse of the lower thin film structure 100, the upper thin film structure 200, the lower insulating layer 160, and the upper insulating layer 260.

Referring to FIGS. 10A, 11A, and 12A and FIGS. 10B, 11B, and 12B, a three-dimensional semiconductor device will be described according to second embodiments of the inventive concepts.

Figure 10A:
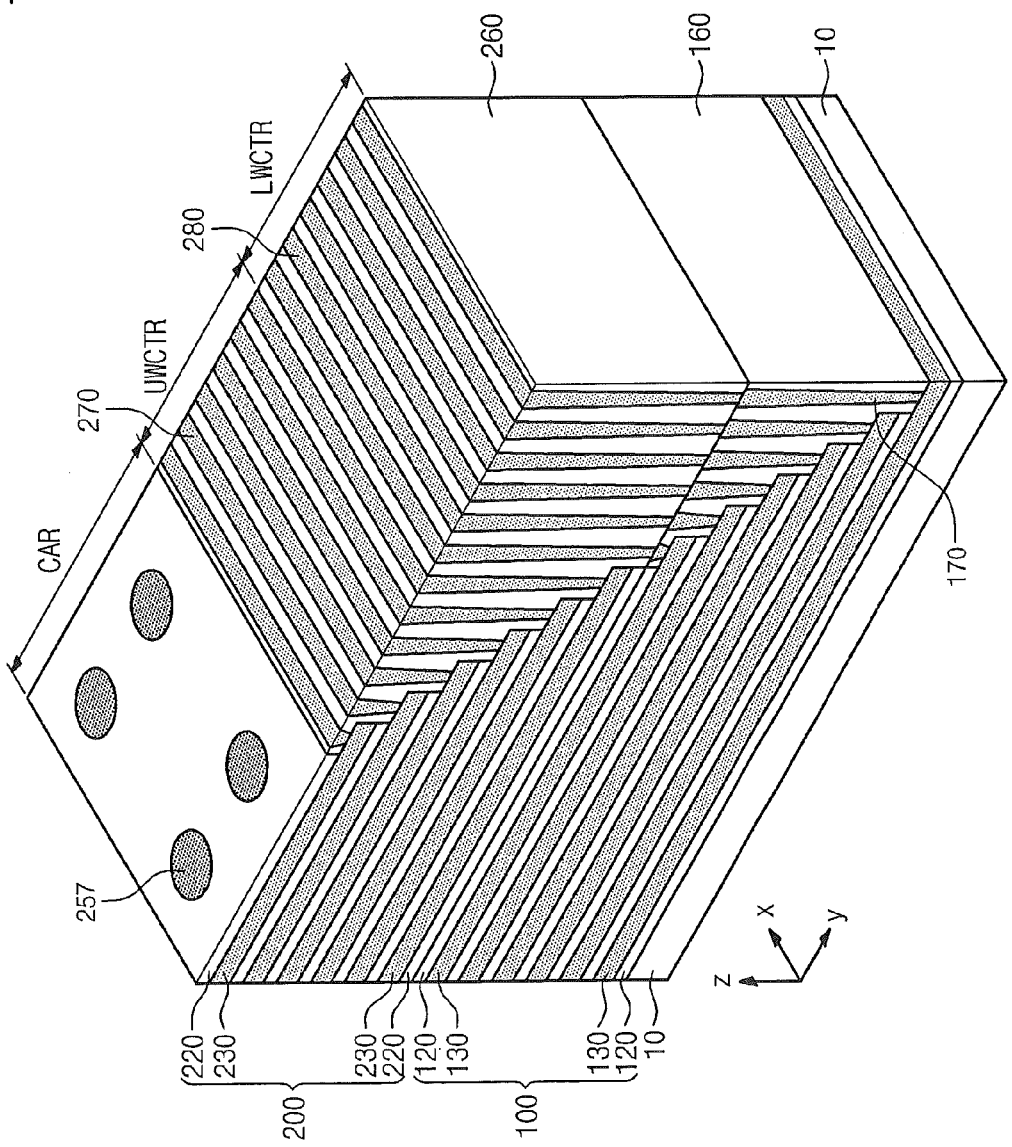
FIGS. 10A, 11A, and 12A are perspective views illustrating sequential operations of manufacturing a three-dimensional semiconductor device according to second embodiments of inventive concepts.
Figure 11A:
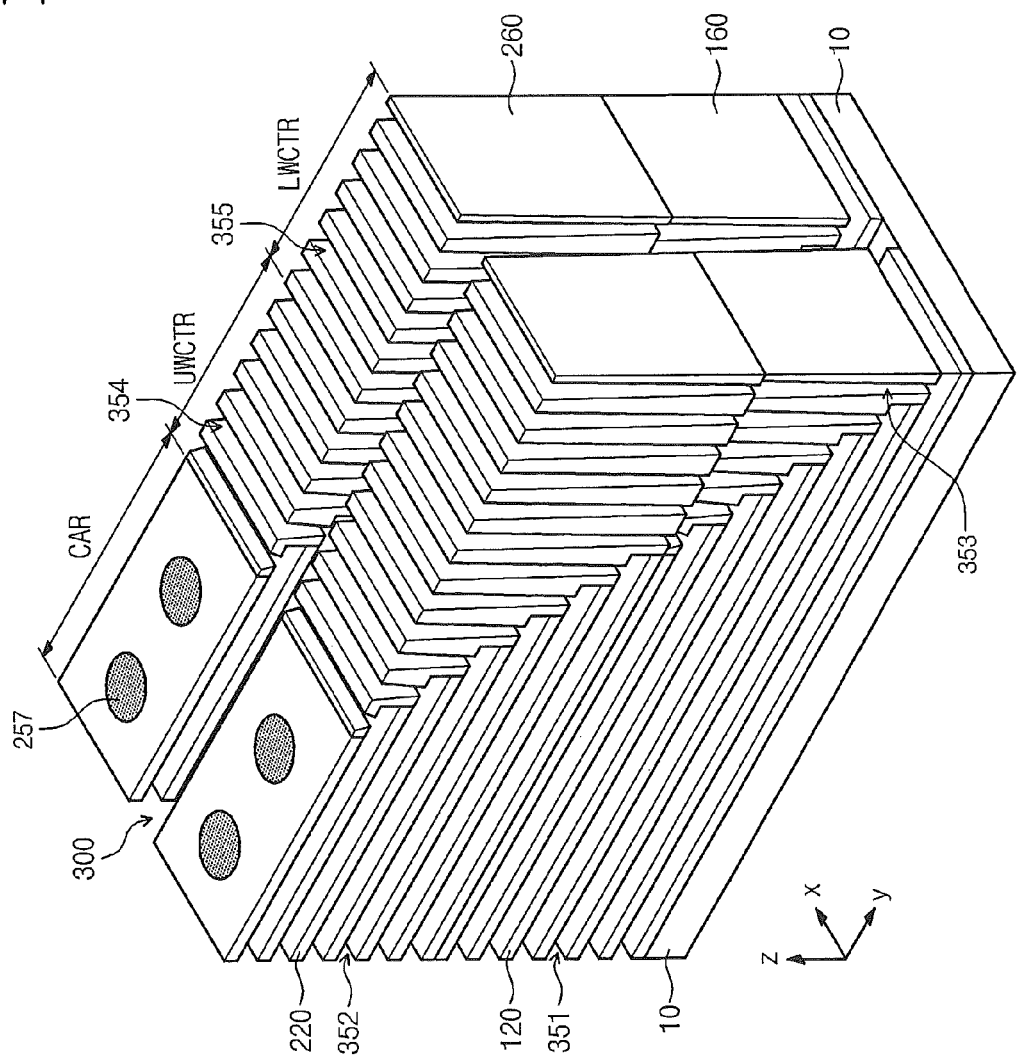
Figure 11B:
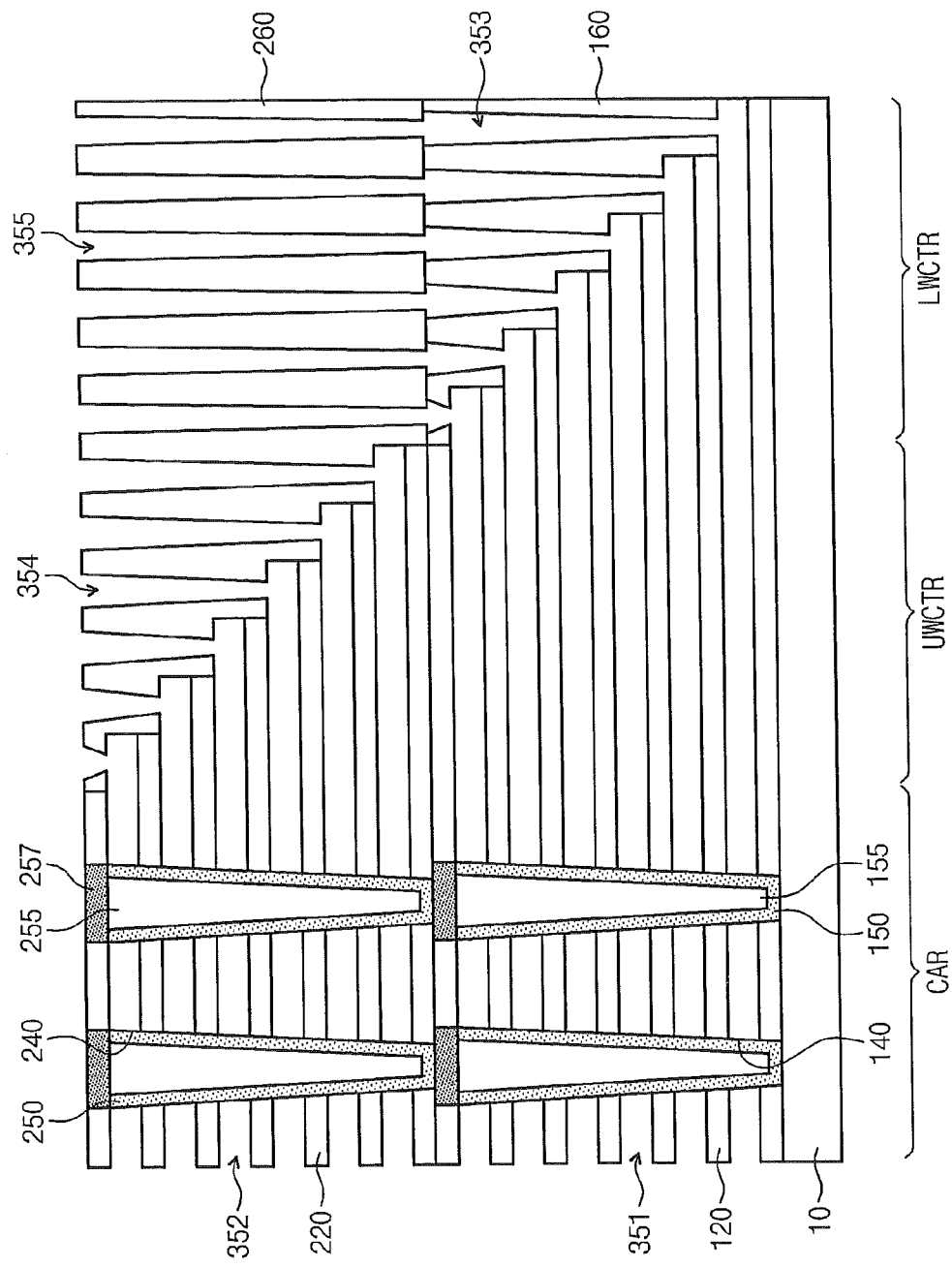
Figure 12A:
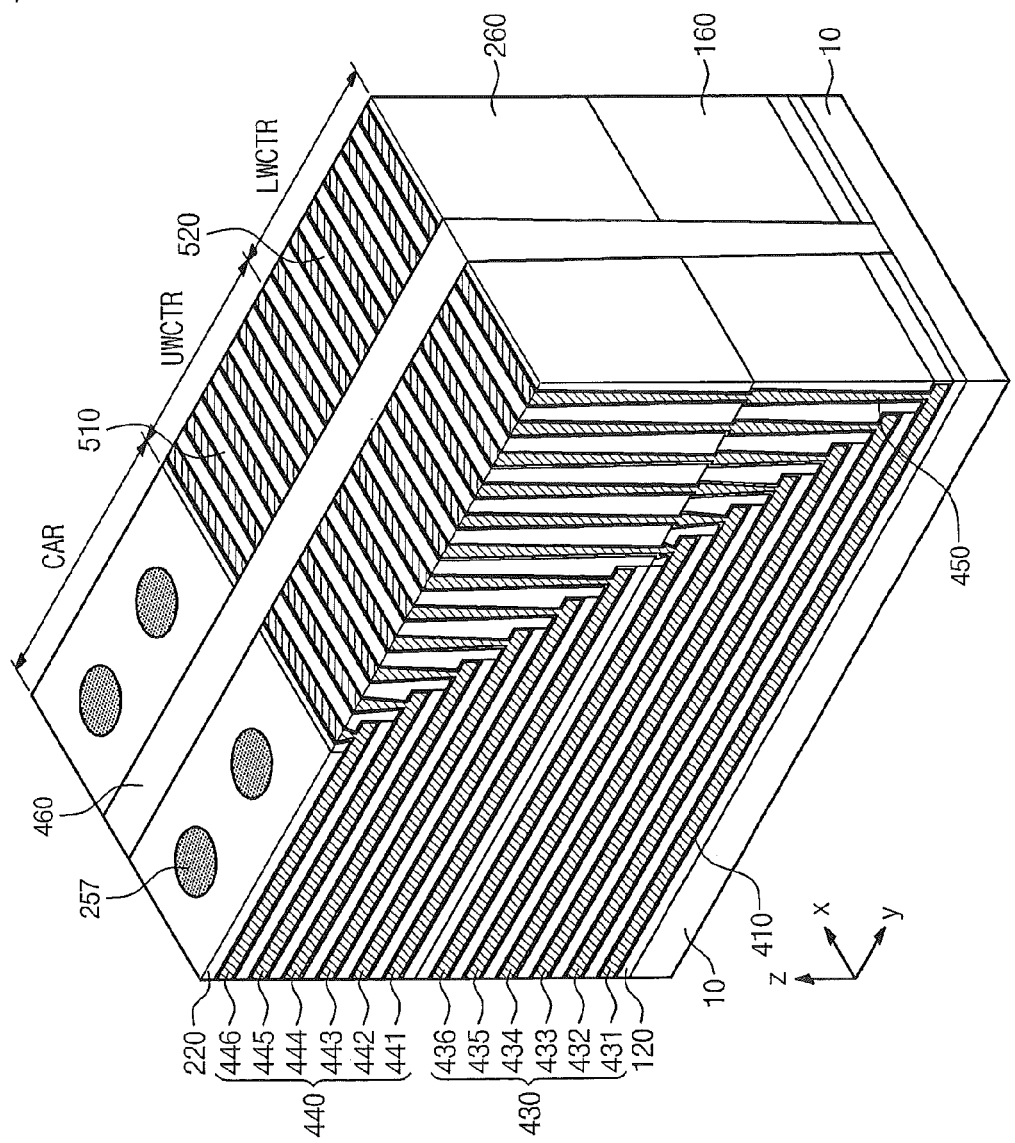
Figure 12B:
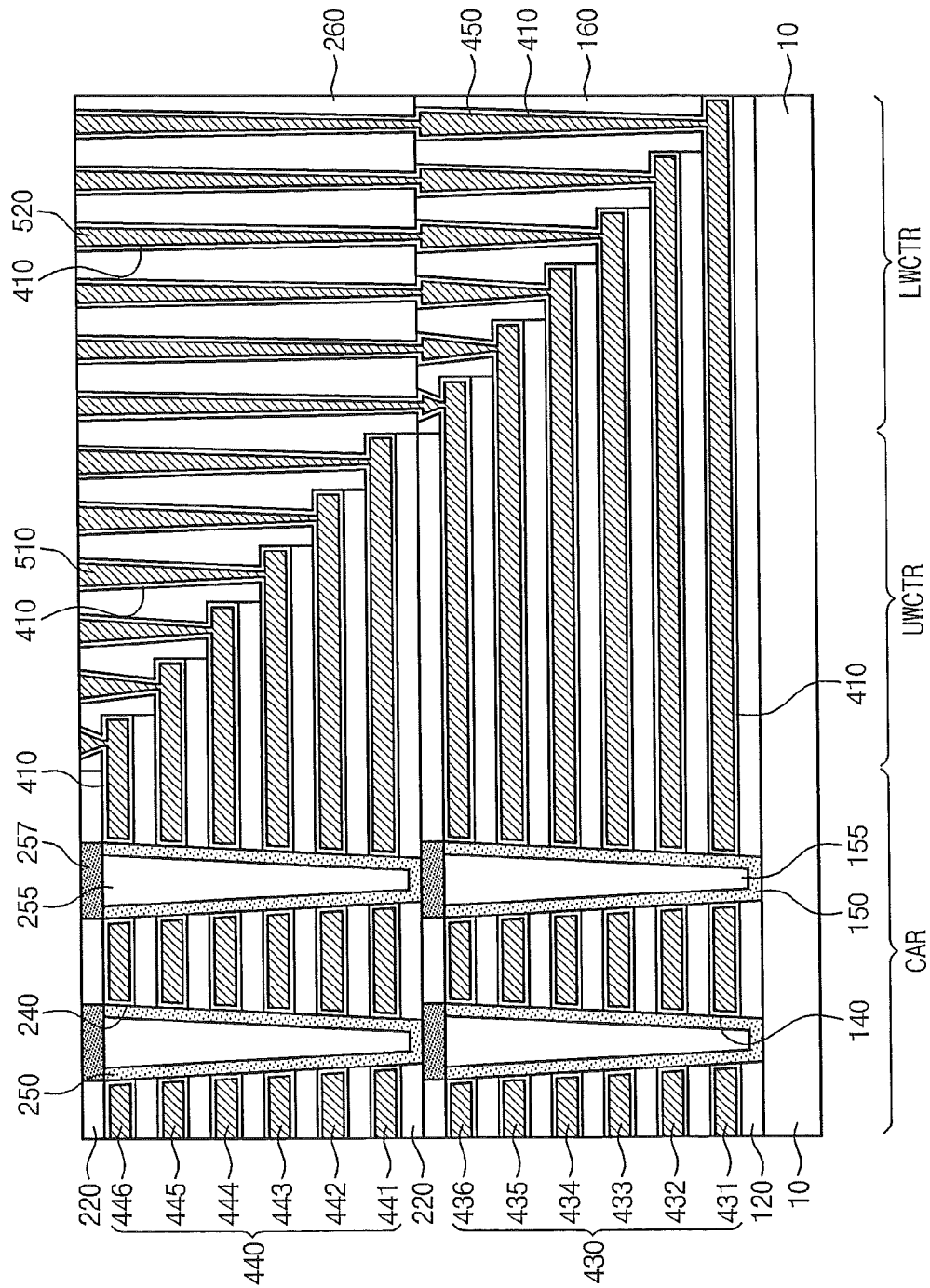

FIGS. 10A, 11A, and 12A are diagrams sequentially illustrating a method of manufacturing the three-dimensional semiconductor device according to second embodiments of inventive concepts. FIGS. 10B, 11B, and 12B are diagrams sequentially illustrating the method of manufacturing the three-dimensional semiconductor device according to second embodiments of inventive concepts taken along cross sections of a y-z plane of FIGS. 10A, 11A, and 12A.

The method of manufacturing the three-dimensional semiconductor device according to second embodiments of inventive concepts is different from the method according to first embodiments of inventive concepts, in that the contact plugs connected to the upper conductive patterns are also formed together with the upper conductive patterns. Repeated technical features from first embodiments of inventive concepts are omitted for conciseness. The method of manufacturing the three-dimensional semiconductor device according to other embodiments of inventive concepts will be described with reference to FIGS. 4A, 4B, and 4C.

Referring to FIGS. 10A and 10B, upper semiconductor patterns 250 are formed in the upper thin film structure 200, and then, first upper sacrificial contact patterns 270 and second upper sacrificial contact patterns 280 are formed in the upper word line contact regions UWCTR and the lower word line contact regions LWCTR, respectively.

The forming of the first upper sacrificial contact patterns 270 and the second upper sacrificial contact patterns 280 may include: forming upper contact openings 261 and 262 in the upper insulating layers 260; and forming a sacrificial material in the upper contact openings 261 and 262. The upper contact openings 261 and 262 may include first upper contact openings 261 formed in the upper word line contact region UWCTR and second upper contact openings 262 formed in the lower word line contact region LWCTR.

Specifically, the forming of the upper contact openings 261 and 262 may include: forming a mask pattern defining the positions of the upper contact openings 261 and 262 on the upper insulating layer 260; and etching the upper insulating layer 260 using the mask pattern as an etching mask.

In forming the mask pattern defining the positions of the upper contact openings 261 and 262, a line-shaped mask pattern may be formed. That is, the upper contact openings 261 and 262 may define a line-shaped plane. The etching of the upper insulating layer 260 may be performed by anisotropic etching. Therefore, the upper contact openings 261 and 262 may each have a width that is narrower in the lower portion than in the upper portion.

Since the upper thin film structure 200 has the terraced shape in the upper word line contact region UWCTR, the first upper contact openings 261 are formed to expose the upper sacrificial layers 230 located at different heights from the substrate 10. Patterning the upper insulating layer 260 repeatedly may be performed to form the upper thin film structure 200 in the terraced shape. That is, the first upper contact openings 261 different from each other in the etching depth may be formed in the upper word line contact region UWCTR. Moreover, since the upper thin film structure 200 has a lamination structure in which the adjacent one-sidewalls of the upper sacrificial layers 230 are spaced from each other at a predetermined interval, one first upper contact opening 261 may be formed between the one-sidewalls of the upper sacrificial layers 130 vertically adjacent to each other.

The second upper contact openings 262 may expose the line-shaped upper surfaces of the lower sacrificial contact patterns 170.

Subsequently, the first upper sacrificial contact patterns 270 and the second upper sacrificial contact patterns 280 are formed by burying the first upper contact openings 261 and the second upper contact openings 262 with a sacrificial material, respectively. The first upper sacrificial contact patterns 270 and the second upper sacrificial contact patterns 280 may be formed by performing deposition and planarization the same material as that of the upper sacrificial layers 230 included in the upper thin film structure 200. Therefore, the first upper sacrificial contact patterns 270 may be formed in the upper word line contact region UWCTR so as to have a line-shaped horizontal configuration. The second upper sacrificial contact patterns 280 may be formed in the lower word line contact region LWCTR so as to have a line-shaped horizontal configuration.

The first upper sacrificial contact patterns 270 may be formed at different heights so as to be connected to the upper sacrificial layers 230. That is, the first upper sacrificial contact patterns 270 may respectively be formed to correspond to the upper sacrificial layers 230 laminated in the terraced shape in the upper word line contact region UWCTR. In this way, the upper sacrificial layers 230 formed at the different heights may respectively be connected to the first upper sacrificial contact patterns 270 formed simultaneously with the upper sacrificial layers 230 by the same process.

In contrast, the second upper sacrificial contact patterns 280 may be formed at the same height so as to be connected to the lower sacrificial contact patterns 170. The second upper sacrificial contact patterns 280 may be formed on the lower sacrificial contact patterns 170, respectively.

According to other embodiments of inventive concepts, supporting members (not illustrated) may be formed in the upper word line contact region UWCTR and the lower word line contact region LWCTR to support the upper thin film structure 200, before or after first upper sacrificial contact patterns 270 and the second upper sacrificial contact patterns 280 are formed in first embodiments of inventive concepts.

Referring to FIGS. 11A and 11B, trenches 300 are formed between the upper semiconductor patterns 250 so as to penetrate the lower thin film structure 100 and the upper thin film structure 200, as described with reference to FIGS. 4A through 4C.

The trenches 300 may be spaced from the lower semiconductor patterns 150 and the upper semiconductor patterns 250 and may intersect the first upper sacrificial contact patterns 270 with the line-shaped plane, the second upper sacrificial contact patterns 280 with the line-shaped plane, and the lower sacrificial contact patterns 170. As the trenches 300 are formed, the first upper sacrificial contact patterns 270 with the line-shaped plane may be patterned, the second upper sacrificial contact patterns 280 with the line-shaped plane may be patterned, and the lower sacrificial contact patterns 170 may be patterned. Therefore, the first upper sacrificial contact patterns 270, the second upper sacrificial contact patterns 280, and the lower sacrificial contact patterns 170 may have a horizontal cross-section of a rectangular shape, and the sidewalls thereof may be exposed.

Subsequently, as described with reference to FIGS. 4A through 4C, the recess regions 351 to 355 are formed by selectively removing the upper sacrificial layers 230 and the lower sacrificial layers 130 (of which the sidewalls are exposed by the trenches 300), and the lower sacrificial contact patterns 170 and the upper sacrificial contact patterns 270 and 280.

Specifically, the forming of the recess regions 351 to 355 may include isotropic etching performed on the upper sacrificial layers 230 and the lower sacrificial layers 130 using an etching recipe having etching selectivity with respect to the upper inter-layer insulating layers 220 and the lower inter-layer insulating layers 120. The lower sacrificial contact patterns 170 and the upper sacrificial contact patterns 270 and 280 come into contact with the upper sacrificial layers 230 and the lower sacrificial layers 130, respectively, and are formed of the same material. Therefore, the lower sacrificial contact patterns 170 and the upper sacrificial contact patterns 270 and 280 may be removed together, when the upper sacrificial layers 230 and the lower sacrificial layers 130 are removed.

Therefore, the lower recess regions 351 may be formed in the lower inter-layer insulating layer 120. The upper recess regions 352 may be formed between the upper inter-layer insulating layers 220. Simultaneously, the lower contact recess regions 353 and the second upper recess regions 355 may be formed in the lower word line contact region LWCTR, and the first upper recess regions 354 may be formed in the upper word line contact region UWCTR.

That is, according to embodiments of inventive concepts, there may be formed substantially simultaneously the upper recess regions 352, the lower recess regions 351, the lower contact recess regions 353, the first upper recess regions 354, and the second upper recess regions 355. The first upper recess regions 354 may be connected continuously to the upper recess regions 352. The lower contact recess regions 353 and the second upper recess regions 355 may be connected continuously to the lower recess regions 351.

Referring to FIGS. 12A and 12B, the information storing layer 410 and the conductive layer 420 are formed in the recess regions 351 to 355 and the trench 300, as described with reference to FIGS. 5A, 5B, and 5C.

The information storing layer 410 may be formed using a deposition technique (for example, chemical vapor deposition or atomic layer deposition) capable of providing good step coverage. The information storing layer 410 may substantially be formed so as to conformally cover the product in which the upper recess regions 351 and 352 and the lower and upper contact recess regions 353 to 355 are formed.

More specifically, the information storing layer 410 may be formed on the surface of the lower insulating layers 160 and the upper insulating layers 260 exposed to the upper recess regions 352, the lower recess regions 351, and the lower and upper contact recess regions 353 to 355. The information storing layer 410 may extend continuously from the lower recess regions 351 to the second upper contact recess regions 355 via the lower contact recess region 353. Moreover, the information storing layer 410 may extend from the upper recess region 352 to the first upper contact recess region 354.

Subsequently, a conductive layer is formed in the recess regions 351 to 355 where the information storing layer 410 is formed. The conductive layer may be formed using a deposition technique (for example, chemical vapor deposition or atomic layer deposition) capable of providing good step coverage. Therefore, a conductive material may fill the recess regions 351 to 355 where the information storing layer 410 is formed.

Subsequently, the conductive layer in the trench 300 is removed to form the lower conductive patterns 430, the upper conductive patterns 440 and the contact plugs 450, 510, and 520 simultaneously. Subsequently, the isolation insulating pattern 460 may be formed by filling the trench 300, from which the conductive layer is removed, with an insulating material.

Specifically, by anisotropically etching the conductive layer in the trench 300, the lower conductive patterns 430 and the upper conductive patterns 440 may be formed in the cell array region CAR so as to be isolated vertically. By anisotropically etching the conductive layer in the trench 300, the lower buried contact plugs 450 and the upper buried contact plugs 510 and 520 may be formed in the upper word line contact region UWCTR and the lower word line contact region LWCTR, respectively. The upper buried contact plugs 510 and 520 include first upper buried contact plugs 510 extending continuously from the upper conductive patterns 440 and second upper buried contact plugs 520 extending from the lower buried contact plugs 450.

In the anisotropic etching of the conductive layer, the trench 300 may expose the sidewalls of the lower conductive patterns 430 and the upper conductive patterns 440 and the sidewalls of the lower buried contact plugs 450 and the upper buried contact plugs 510 and 520.

Since the upper conductive pattern 440 and the first upper buried contact plug 510 are formed by the same processes, the lower conductive patterns 430 and the buried contact plugs 450 are formed of the same conductive material, and no boundary is formed between the upper conductive pattern 440 and the first upper buried contact plug 510. Likewise, no boundary is formed between the lower conductive pattern 430 and the lower buried contact plug 450. Moreover, since the lower buried contact plug 450 and the second upper buried contact plug 520 are formed simultaneously, no boundary is formed between the lower buried contact plug 450 and the second upper buried contact plug 520 either.

Figure 13:
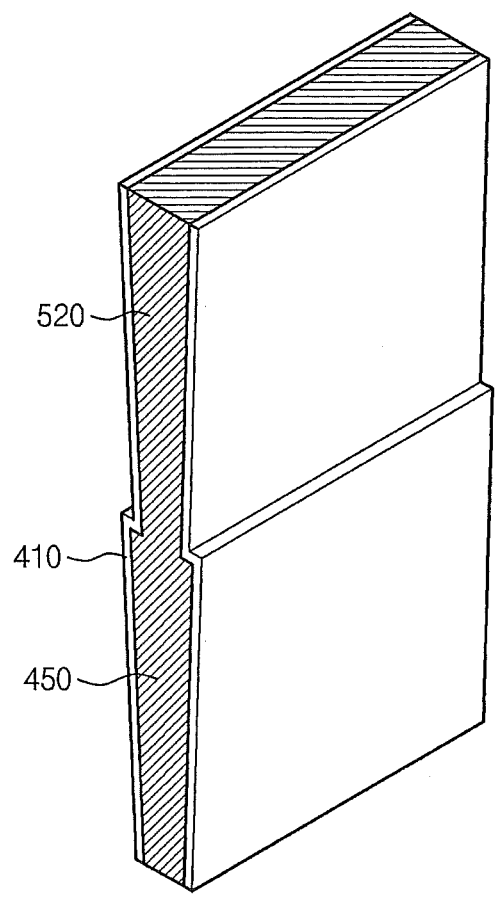
FIG. 13 is a perspective view illustrating a contact structure of a three-dimensional semiconductor device according to second embodiments of inventive concepts.

Specifically, as illustrated in FIG. 13, the contact structure formed in the lower word line contact region LWCTR extends from the lower conductive pattern 430 and may include the lower buried contact plug 450 and the upper buried contact plug 520. No boundary is formed between the lower buried contact plug 450 and the upper buried contact plug 520.

As described with reference to FIGS. 10A and 10B, the contact structure includes the conductive layers locally formed in the contact recess regions 351 to 355 where the lower sacrificial contact patterns 170 and the upper sacrificial contact patterns 270 and 280 are formed so as to have the line-shaped horizontal cross-section and the lower sacrificial contact patterns 170 and the upper sacrificial contact patterns 270 and 280 are removed. Therefore, the lower buried contact plugs 450 and the upper buried contact plugs 520 may have at least four side surfaces. In the lower buried contact plugs 450 and the upper buried contact plugs 520, a lower width may be narrower than an upper width. Therefore, the width may become sharply different in the boundary between the lower buried contact plug 450 and the upper buried contact plug 520.

The lower buried contact plugs 450 and the upper buried contact plugs 520 may have a horizontal cross-section of a substantially rectangular shape. In this case, the length of one of two sides defining the horizontal cross-section of the rectangular shape may substantially be the same as the width of the lower conductive pattern 430.

The information storing layer 410 may be formed on both sidewalls of the lower buried contact plugs 450 and the upper buried contact plugs 520 having the continuously extending configuration.

Hereinafter, referring to FIGS. 14 through 17, a method of manufacturing a three-dimensional semiconductor device will be described according to third embodiments of inventive concepts. FIGS. 14 through 17 are cross-sectional views illustrating a method of manufacturing the three-dimensional semiconductor device according to third embodiments of inventive concepts. In FIGS. 14 through 17, the same reference numerals are given to the same constituent elements as those in other embodiments of inventive concepts and the description thereof is omitted.

Figure 14:
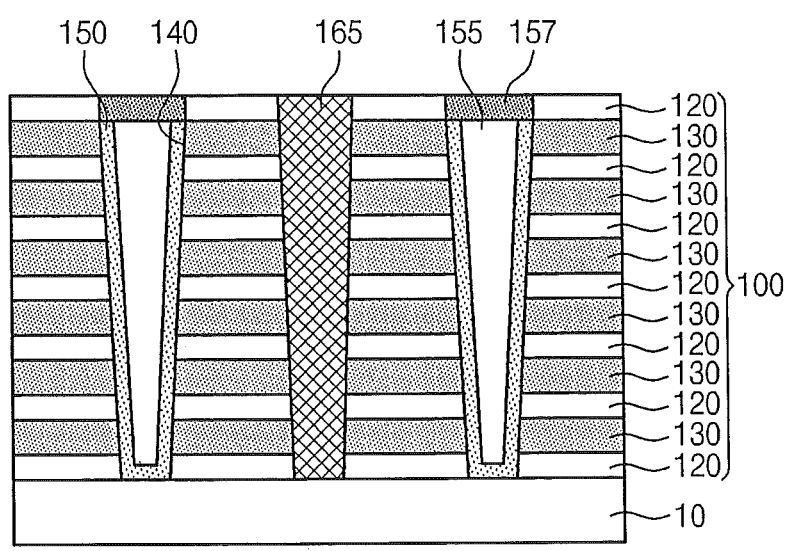
FIGS. 14 through 17 are cross sectional views illustrating a method of manufacturing a three-dimensional semiconductor device according to third embodiments of inventive concepts.

Referring to FIG. 14, the lower thin film structure 100 is formed on the substrate 10, and then lower semiconductor patterns 150 are formed in the lower through-holes 140 penetrating the lower thin film structure 100, as described with reference to FIGS. 2A through 2C.

Subsequently, lower sacrificial patterns 165 are formed between the lower though-holes 140 to penetrate the lower thin film structure 100. The lower sacrificial patterns 165 may be formed before the lower semiconductor patterns 150 are formed.

More specifically, the forming of the lower semiconductor patterns 150 may include: forming line-shaped preliminary lower trenches penetrating the lower thin film structure 100; forming sacrificial layers filling the preliminary lower trenches; and etching the sacrificial layer until the upper surface of the lower thin film structure 100 is exposed.

The preliminary lower trenches may be formed by anisotropically etching the lower thin film structure 100. In the preliminary lower trenches, a lower width may be narrower than an upper width.

The sacrificial layer filling the preliminary trenches may be formed of a material having etching selectivity with respect to the lower inter-layer insulating layers 120. For example, the lower sacrificial patterns may be formed of the same material as that of the lower sacrificial layers 130 of the lower thin film structure 100.

As described with reference to FIGS. 2A through 2C, the lower sacrificial contact patterns 170 may be formed in the lower word line contact region LWCTR, before or after the lower sacrificial patterns 165 are formed.

Figure 15:
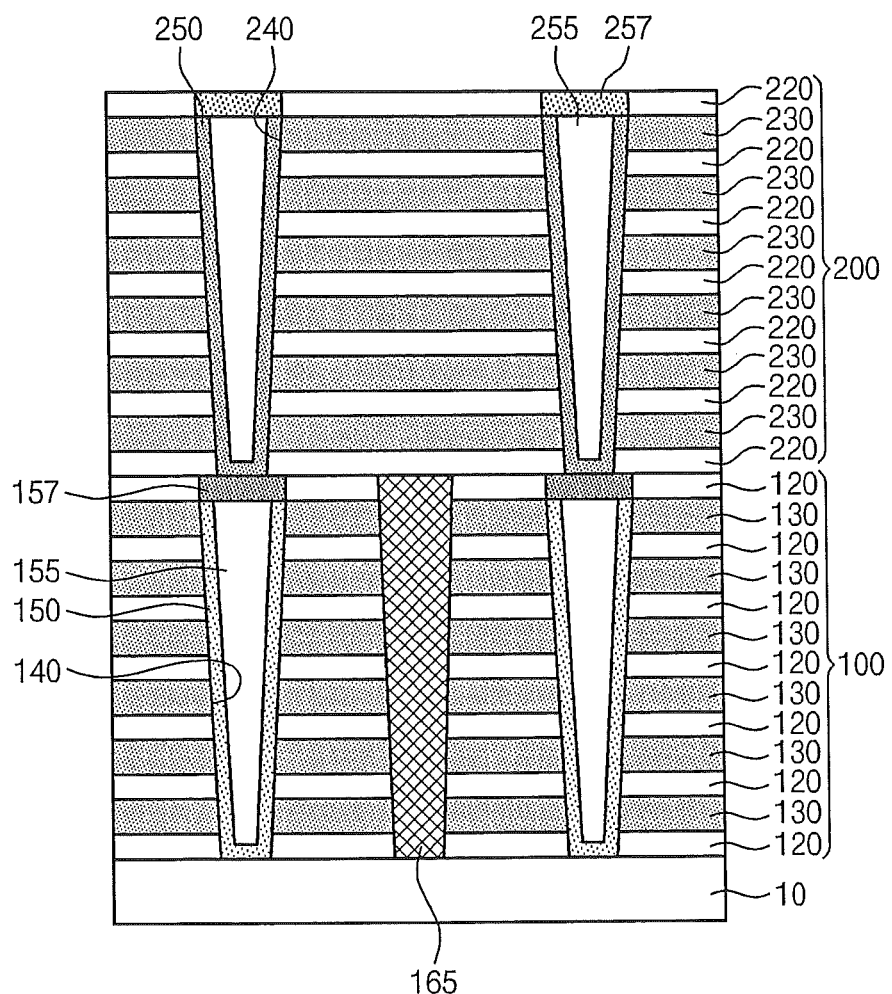

Referring to FIG. 15, the upper thin film structure 200 is formed on the lower thin film structure 100 in which the lower semiconductor patterns 150 are formed. In the upper thin film structure 200, the upper semiconductor patterns 250 may be formed in the upper through-holes 240 to penetrate the upper thin film structure 200, as described with reference to FIGS. 3A, 3B, and 3C.

Figure 16:
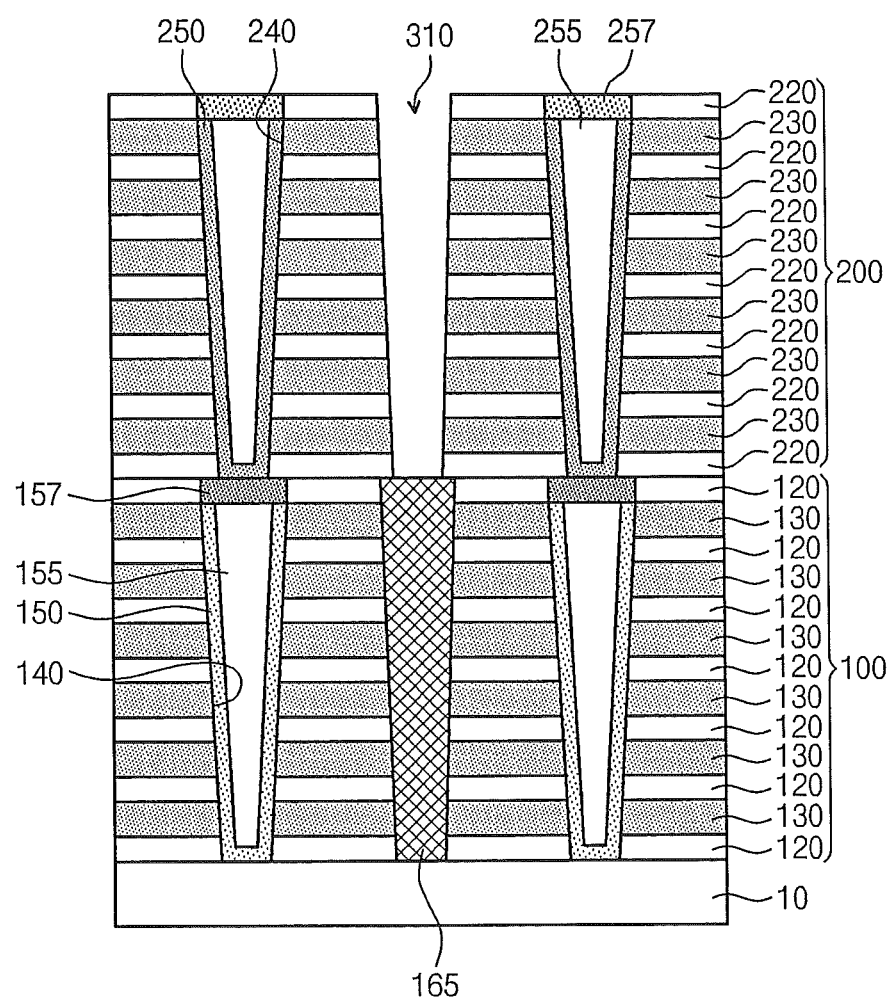

Referring to FIG. 16, an upper trench 310 may be formed in the upper thin film structure 200 to expose the upper surface of the lower sacrificial pattern 165. In order to form the upper trench 310, the upper thin film structure 200 may be subjected to anisotropic etching. Therefore, in the upper trench 310, a lower width may be narrower than an upper width. The lower width of the trench 310 may be narrower than the upper width of the lower sacrificial pattern 165.

Figure 17:
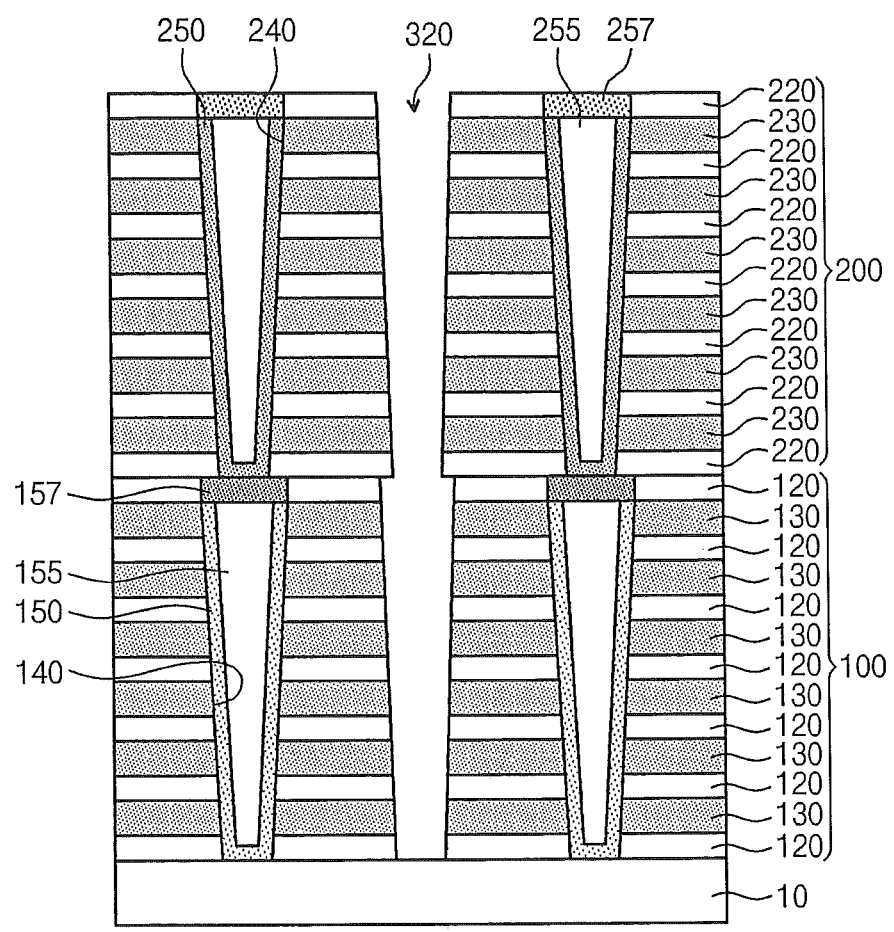

Referring to FIG. 17, a trench 320 is formed to penetrate the lower thin film structure 100 and the upper thin film structure 200 by removing the lower sacrificial patterns 165 exposed by the upper trench 310.

The removing of the lower sacrificial patterns 165 may include anisotropically etching the line-shaped lower sacrificial patterns 165 using an etching recipe having etching selectivity with respect to the thin films of the lower thin film structure 100 and the upper thin film structure 200.

The trench 320 formed in this way may expose the sidewalls of the lower inter-layer insulating layers 120, the upper inter-layer insulating layers 220, the lower sacrificial layers 130, and the upper sacrificial layers 230.

On the other hand, when the lower sacrificial patterns 165 are subjected to isotropic etching, as described with reference to FIGS. 4A through 4C, the lower sacrificial layers 130, the upper sacrificial layers 230, and the lower sacrificial contact patterns 170 may be subjected to isotropic etching simultaneously. In this way, the lower recess regions 351 and the upper recess regions 352 may be formed between the lower inter-layer insulating layers 120 and the upper inter-layer insulating layers 220, respectively. Moreover, the contact recess regions 353 may be formed in the lower insulating layer 160.

Figure 18:
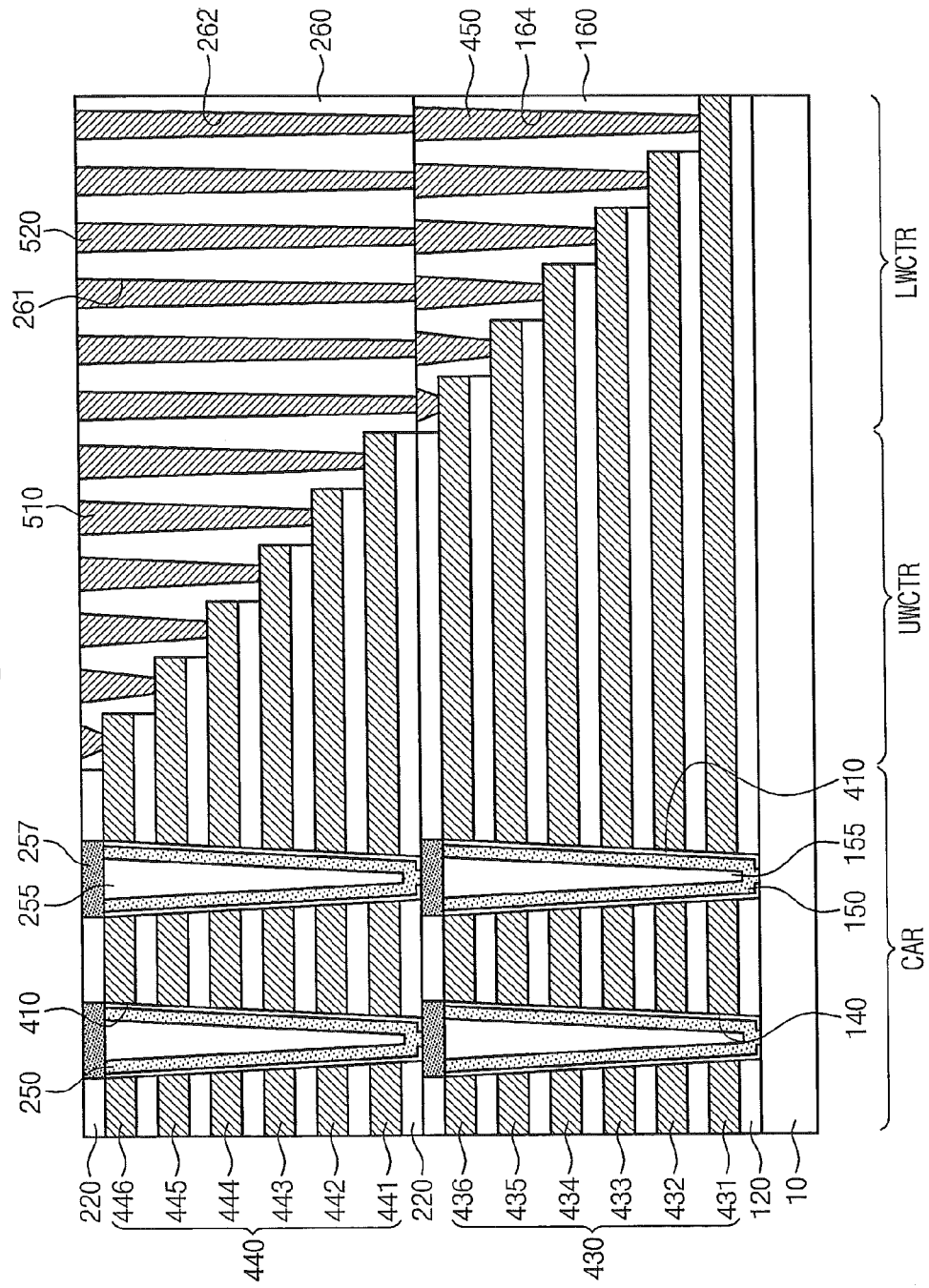
FIG. 18 is a cross sectional view illustrating a three-dimensional semiconductor device according to fourth embodiments of inventive concepts.

FIG. 18 is a diagram illustrating a method of manufacturing a three-dimensional semiconductor device according to a fourth embodiment of the inventive concept.

Referring to FIG. 18, the three-dimensional semiconductor device includes the lower wiring structure 430 and the upper wiring structure 440 laminated on the substrate 10. The lower wiring structure 430 includes the lower conductive patterns 431 to 436 laminated via the lower inter-layer insulating layers 120. The upper wiring structure 440 includes the upper conductive patterns 441 to 446 laminated via the upper inter-layer insulating layers 220. The lower conductive patterns 431 to 436 and the upper conductive patterns 441 to 446 may contain at least one of doped polysilicon, metal layers, metal nitride layers, and metal silicides. In this embodiment of the inventive concept, the lower wiring structure 430 and the upper wiring structure 440 may be formed by alternately laminating inter-layer insulating layers and conductive layers without a sacrificial layer.

The areas of the lower conductive patterns 431 to 436 and the upper conductive patterns 441 to 446 may be reduced, as these conductive patterns are more distant from the substrate 10. The distance between the cell array region CAR and the sidewalls of the lower conductive patterns 431 to 436 and the upper conductive patterns 441 to 446 may be reduced, as these conductive patterns are more distant from the substrate 10.

In this embodiment of the inventive concept, the lower conductive patterns 431 to 436 and the upper conductive patterns 441 to 446 may have a plate type configuration or a line-shaped configuration, as in first embodiments of the inventive concepts.

In the cell array region CAR, the lower semiconductor patterns 150 may be formed to penetrate the lower wiring structure 430 and the upper semiconductor patterns 250 may be formed to penetrate the upper wiring structure 440 and to come into contact with the lower semiconductor patterns 150. The lower semiconductor patterns 150 may come into contact with the substrate 10. That is, the lower semiconductor patterns 150 and the upper semiconductor patterns 250 may be formed perpendicular to the substrate 10. According to other embodiments of inventive concepts, the boundary between lower semiconductor pattern 150 and the upper semiconductor pattern 250 may have a continuous crystalline structure without a discontinuous boundary surface caused due to crystals.

The information storing layer 410 is interposed between the upper and lower conductive patterns 431 to 436 and 441 to 446 and the upper and lower semiconductor patterns 150 and 250. The information storing layer 410 may wrap around circumferences of lower semiconductor patterns 150 and upper semiconductor patterns 250.

The lower wiring structure 430 and the upper wiring structure 440 may be different from each other in the structure of the contact plugs connected to the conductive patterns 431 to 436 and 441 to 446.

Specifically, the lower conductive patterns 431 to 436 are directly connected to the first lower contact plugs 450 in the lower word line contact region LWCTR, and the second lower contact plugs 520 are directly connected electrically to upper surfaces of the first lower contact plugs 450. The one-sidewalls of the lower conductive patterns 431 to 436, which are vertically adjacent to each other in the lower word line contact region LWCTR, are spaced from each other at a predetermined interval. One first lower contact plug 450 may be disposed between the one-sidewalls of the lower conductive patterns 431 to 436 vertically adjacent to lower contact plugs 450 and may be formed of the same material of the lower conductive patterns 431 to 436. That is, the first lower contact plugs 450 may contain at least one of doped polysilicon, metal layers, metal nitride layers, and metal silicides. The first lower contact plugs 450 and the second lower contact plugs 520 may also be formed of the same material.

The upper conductive patterns 441 to 446 are connected electrically to the upper contact plugs 510 in the upper word line contact region UWCTR. The upper contact plugs 510 may be formed of the same conductive material as that of the upper conductive patterns 441 to 446.

In this embodiment of the inventive concept, the first lower contact plugs 450 and the second lower contact plugs 520 may be formed in other steps. That is, the first lower contact plugs 450 may be formed, before the upper thin film structure 200 is formed.

The forming of the first lower contact plugs 450 includes forming first lower contact holes 164 in the lower insulating layer 160 and filling the first lower contact holes 162 with a conductive material.

The first lower contact holes 162 may be formed by anisotropically etching the lower insulating layer 160. Therefore, in the first lower contact holes 162, a lower width may be less than an upper width. Since the first lower contact holes 162 are formed by patterning the lower insulating layer 160, the distance between the first lower contact holes 162 may be larger than the distance between the lower conductive patterns 431 to 436. The distance between the first lower contact holes 162 may be different depending on the distance between the sidewalls of the lower conductive patterns 431 to 436 vertically adjacent to each other.

The first lower contact plugs 450 formed by filling the first lower contact holes 162 with the conductive material may be formed in a cylindrical shape. In the first lower contact plugs 450 formed in the first lower contact holes 162, a lower width may be smaller than an upper width. The forming of the first lower contact plugs 450 is performed, before the upper thin film structure 200 is formed. Therefore, the maximum thickness of the first lower contact plugs 450 may be smaller than the total thickness of the lower wiring structure 430.

The second lower contact plugs 520 may be formed, after the upper wiring structure 440 is formed. The forming of the second lower contact plugs 520 includes forming upper contact holes 262 on the upper insulating layer 260 to expose the upper surfaces of the first lower contact plugs 450. In this case, the upper contact holes 262 are formed in the upper insulating layer 260 covering the first lower contact plugs 450. The etching depth of the upper contact holes 262 is not larger than the height of the upper wiring structure 440.

That is, by the method for forming the contact hole with the restrictive etching depth, it is possible to form the contact structure with the height larger than the depth of the contact hole. In other words, the lower wiring structure 430 disposed below the upper wiring structure 440 may be connected to the peripheral circuits via the first lower contact plugs 450 and the second lower contact plugs 520 formed in the different steps. Therefore, it is possible to overcome a process restriction that the contact hole is not completely opened due to an increase in the etching depth of the contact hole when the contact plugs are formed to connect the lower wiring structure 430 to the peripheral circuit.

Since the first lower contact plugs 450 and the second lower contact plugs 520 are formed in the different steps, the maximum width (that is, the width of the uppermost contact plug) of the first lower contact plugs 450 may be larger than the minimum width (that is, the width of the lowermost contact plug) of the second lower contact plugs 520.

In the upper word line contact region UWCTR, as described with reference to FIGS. 6A, 6B, and 6C, the upper contact plugs 510 may be formed to be connected to the upper conducive patterns 441 to 446, respectively.

Figure 19:
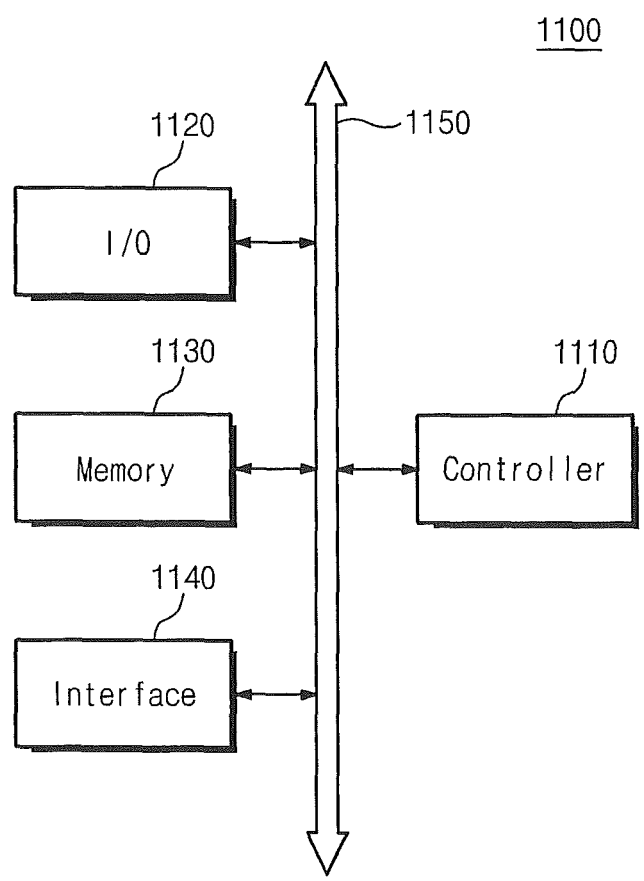
FIG. 19 is a schematic block diagram illustrating an example of a memory system including a non-volatile memory device according to some embodiments of inventive concepts.

FIG. 19 is a schematic block diagram illustrating an example of a memory system including a non-volatile memory device according to embodiments of inventive concepts.

Referring to FIG. 19, a memory system 1100 may be applicable to a PDA, a portable computer, a web tablet, a wireless phone, a mobile phone, a digital music player, a memory card, or any device capable of transmitting and/or receiving information in a wireless environment.

The memory system 1100 includes a controller 1110, an input/output device 1120 such as a keypad, a keyboard, or a display device, a memory 1130, an interface 1140, and a bus 1150. The memory 1130 and the interface 1140 communicate with each other through the bus 1150.

The controller 1110 includes at least one microprocessor, a digital signal processor, a microcontroller, or another process unit similar thereto. The memory 1130 may be used to store commands executed by the controller 1110. The input/output device 1120 may receive data or signals from the outside of the memory system 1100 or output data or signals to the outside of the memory system 1100. For example, the input/output device 1120 may include a keyboard, a keypad, or a display device.

The memory 1130 includes a non-volatile memory device according to embodiments of inventive concepts. The memory 1130 may further include another kind of memory, a volatile memory capable of being accessed at any time, and other various kinds of memories.

The interface 1140 transmits data to a communication network or receives data from a communication network.

Figure 20:
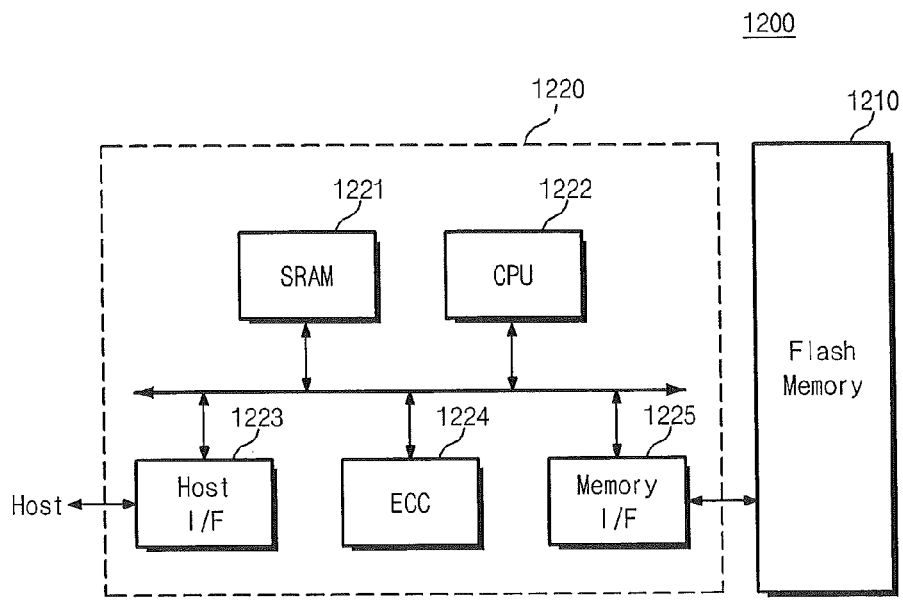
FIG. 20 is a schematic block diagram illustrating an example of a memory card including a non-volatile memory device according to some embodiments of inventive concepts.

FIG. 20 is a schematic block diagram illustrating an example of a memory card including a non-volatile memory device according to embodiments of inventive concepts.

Referring to FIG. 20, a memory card 1200 supporting a large data storing ability is mounted with a flash memory device 1210 according to inventive concepts. The memory card 1200 according to inventive concepts includes a memory controller 1220 generally controlling data exchange between a host and the flash memory device 1210.

An SRAM 1221 is used as a working memory of a processing unit 1222. A host interface 1223 has a data exchange protocol of a host connected to the memory card 1200. An error correction coding block 1224 detects and corrects errors contained in data read from the multi-bit flash memory device 1210. A memory interface 1225 interfaces the flash memory device 1210 according to inventive concepts. The processing unit 1222 generally controls data exchange of the memory controller 1220. Although not illustrated in the drawing, it is apparent to those skilled in the art that the memory card 1200 according to inventive concepts may further include a ROM (not illustrated) storing code data used to interface with the host.

Figure 21:
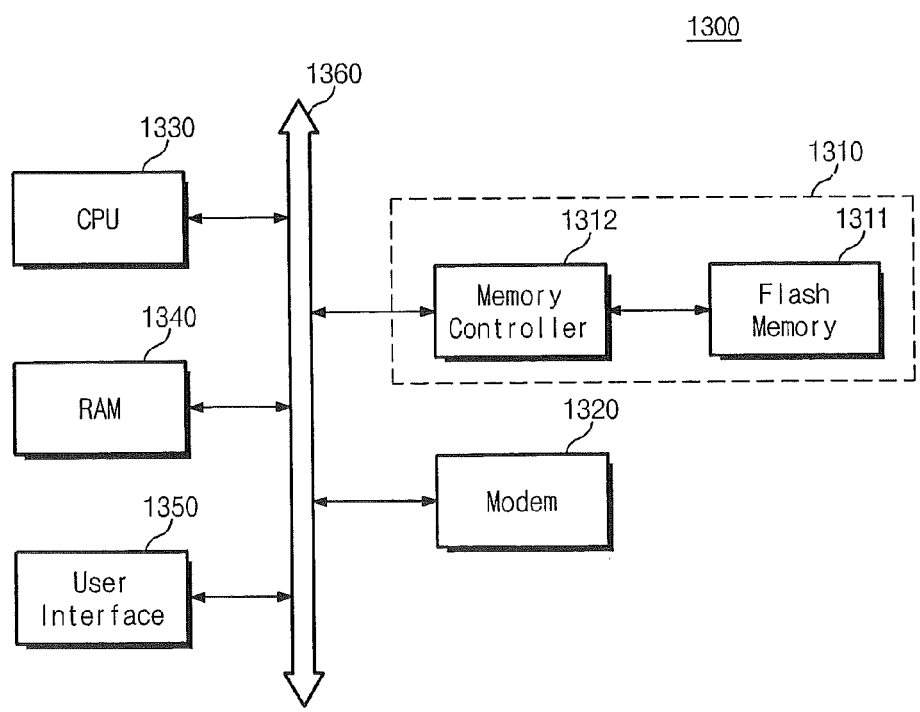
FIG. 21 is a schematic block diagram illustrating an example of an information processing system including a non-volatile memory device according to some embodiments of inventive concepts.

FIG. 21 is a schematic block diagram illustrating an example of an information processing system including a non-volatile memory device according to inventive concepts.

Referring to FIG. 21, a flash memory system 1310 according to inventive concepts is mounted in an information processing system such as a mobile device or a desktop computer. An information processing system 1300 according to inventive concepts includes a modem 1320, a central processing unit 1330, a RAM 1340, and a user interface 1350 electrically connected to the flash memory system 1310 via a system bus 1360. The flash memory 1310 may have substantially the same configuration as that of the memory system or the flash memory system mentioned above. The flash memory system 1310 stores data processed by the central processing unit 1330 or data input from the outside. Here, the above-described flash memory system 1310 may be formed as a solid state drive (SSD). In this case, the information processing system 1300 may stably store large amounts of data in the flash memory system 1310. Since a resource necessary for error correction may be reduced in the flash memory system 1310 with an increase in reliability, a high-speed data exchanging function may be realized in the information processing system 1300. Although not illustrated, it is apparent to those skilled in the art that an application chipset, a camera image processor (CIS), an input/output device, or the like may further be included in the information processing system 1300 according to the inventive concepts.

Flash memory devices and/or memory systems according to inventive concepts may be realized in various types of packages. For example, flash memory devices or the memory systems according to inventive concepts may be packaged as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flat-pack (TQFP), system in package (SIP), multi chip package (MCP), wafer-level fabricated package (WFP), or wafer-level processed stack package (WSP).

In the three-dimensional semiconductor devices according to embodiments of inventive concepts, it is possible to overcome a process restriction that is caused due to an increase in the height of the contact plugs connecting memory cells to peripheral circuits as the number of laminated memory cells is increased.

That is, by using a process technique to form the contact plugs of which a height is lower than the total height of the laminated word lines, it is possible to form the contact structure connecting the word lines located in the lowermost portion to the wiring disposed above the laminated word lines.

Although inventive concepts have been described in connection with embodiments thereof illustrated in the accompanying drawings, it is apparent to those skilled in the art that various substitutions, modifications and changes may be made thereto without departing from the scope of inventive concepts. Therefore, it should be understood that the above-described embodiments are illustrative and are should not limit the scope of inventive concepts.

What is claimed is:

1. A three-dimensional semiconductor device comprising;
   a substrate including wiring and contact regions;
   a thin film structure on the wiring and contact regions of the substrate, wherein the thin-film structure includes a plurality of alternating wiring layers and inter-layer insulating layers defining a terraced structure in the contact region so that each of the wiring layers includes a contact surface in the contact region that extends beyond others of the wiring layers more distant from the substrate; and
   a plurality of contact structures extending in a direction perpendicular to a surface of the substrate wherein each of the contact structures is electrically connected to a contact surface of a respective one of the wiring layers, wherein an interface between one of the contact structures and the respective wiring layer has a total length in a direction parallel to an adjacent edge of the respective wiring layer wherein the total length of the interface is substantially the same as a total length of the adjacent edge of the respective wiring layer.

2. The three-dimensional semiconductor device of claim 1 wherein adjacent ones of the wiring layers are separated by a first distance in a first direction perpendicular to the surface of the substrate, wherein adjacent ones of the contact structures are separated by a second distance in a second direction parallel to the surface of the substrate, and wherein the second distance is greater than the first distance.

3. The three-dimensional semiconductor device of claim 1 wherein each of the contact structures has a first width adjacent a respective one of the contact surfaces that is less than a second width spaced apart from the respective contact surface.

4. The three-dimensional semiconductor device of claim 1 wherein each of the contact surfaces extends beyond an interface with the respective contact structure in a direction away from the wiring region.

5. The three-dimensional semiconductor device of claim 1 wherein each of the alternating wiring layers defines an area that is greater than areas of wiring layers more distant from the substrate.

6. A three-dimensional semiconductor device comprising:
   a substrate including wiring and contact regions;
   a thin film structure on the wiring and contact regions of the substrate, wherein the thin-film structure includes a plurality of alternating wiring layers and inter-layer insulating layers defining a terraced structure in the contact region so that each of the wiring layers includes a contact surface in the contact region that extends beyond others of the wiring layers more distant from the substrate; and
   a plurality of contact structures extending in a direction perpendicular to a surface of the substrate wherein each of the contact structures is electrically connected to a contact surface of a respective one of the wiring layers,
   wherein an interface between one of the contact structures and the respective wiring layer has a length in a direction parallel to an adjacent edge of the respective wiring layer wherein the length of the interface is substantially the same as a length of the adjacent edge of the respective wiring layer,
   wherein the one of the contact structures is a first one of the contact structures, wherein the respective wiring layer comprises a first wiring layer, wherein the interface comprises a first interface,
   wherein a second interface between a second one of the contact structures and a respective second wiring layer defines an area that is substantially less than an area defined by the first interface.

7. The three-dimensional semiconductor device of claim 1 further comprising:
   semiconductor patterns through the thin film structure; and
   information storing layers between the semiconductor patterns and the wiring layers.

8. The three-dimensional semiconductor device of claim 1 wherein the one of the contact structures has a substantially hexahedron shape.

9. The three-dimensional semiconductor device of claim 1 further comprising:
   a single row of conductive patterns extending through the plurality of alternating wiring layers and inter-layer insulating layers in the wiring region, wherein a memory cell is defined at each intersection of a conductive pattern and a wiring layer so that only the single row of conductive patterns extends through the plurality of alternating wiring layers and inter-layer insulating layers.

10. The three-dimensional semiconductor device of claim 6 wherein the first interface is a substantially rectangular interface, and wherein the second interface is a substantially circular interface.

11. A three-dimensional semiconductor device comprising:
   a substrate including wiring and contact regions;
   a thin film structure on the wiring and contact regions of the substrate, wherein the thin-film structure includes a plurality of alternating wiring layers and inter-layer insulating layers defining a terraced structure in the contact region so that each of the wiring layers includes a contact surface in the contact region that extends beyond others of the wiring layers more distant from the substrate;
   a plurality of contact structures extending in a direction perpendicular to a surface of the substrate wherein each of the contact structures is electrically connected to a contact surface of a respective one of the wiring layers; and
   a single row of conductive patterns extending through the plurality of alternating wiring layers and inter-layer insulating layers in the wiring region, wherein a memory cell is defined at each intersection of a conductive pattern and a wiring layer so that only the single row of conductive patterns extends through the plurality of alternating wiring layers and inter-layer insulating layers,
   wherein an interface between one of the contact structures and the respective wiring layer has a length in a direction parallel to an adjacent edge of the respective wiring layer wherein the length of the interface is substantially the same as a length of the adjacent edge of the respective wiring layer,
   wherein the one of the contact structures is a first one of the contact structures, wherein the respective wiring layer comprises a first wiring layer, wherein the interface comprises a first interface,
   wherein a second interface between a second one of the contact structures and a respective second wiring layer defines an area that is substantially less than an area defined by the first interface.

12. The three-dimensional semiconductor device of claim 11 wherein the one of the contact structures has a substantially hexahedron shape.

13. The three-dimensional semiconductor device of claim 11 wherein adjacent ones of the wiring layers are separated by a first distance in a first direction perpendicular to the surface of the substrate, wherein adjacent ones of the contact structures are separated by a second distance in a second direction parallel to the surface of the substrate, and
   wherein the second distance is greater than the first distance.

14. The three-dimensional semiconductor device of claim 11 wherein each of the contact structures has a first width adjacent a respective one of the contact surfaces that is less than a second width spaced apart from the respective contact surface.

15. The three-dimensional semiconductor device of claim 11 wherein each of the contact surfaces extends beyond an interface with the respective contact structure in a direction away from the wiring region.

16. The three-dimensional semiconductor device of claim 11 wherein each of the alternating wiring layers defines an area that is greater than areas of wiring layers more distant from the substrate.

17. The three-dimensional semiconductor device of claim 11 wherein the first interface is a substantially rectangular interface, and wherein the second interface is a substantially circular interface.

* * * * *